US012610848B2

(12) United States Patent
Hirakawa

(10) Patent No.: US 12,610,848 B2
(45) Date of Patent: Apr. 21, 2026

(54) ELECTRONIC COMPONENT AND METHOD FOR FORMING RESIN LAYER ON ELECTRONIC COMPONENT

(71) Applicant: Murata Manufacturing Co., Ltd., Kyoto (JP)

(72) Inventor: Naganori Hirakawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 368 days.

(21) Appl. No.: 18/331,589

(22) Filed: Jun. 8, 2023

(65) Prior Publication Data

US 2023/0317538 A1      Oct. 5, 2023

Related U.S. Application Data

(63) Continuation of application No. PCT/JP2021/036635, filed on Oct. 4, 2021.

(30) Foreign Application Priority Data

Dec. 18, 2020      (JP) ................................. 2020-210171

(51) Int. Cl.
| | |
|---|---|
| *H10W 74/10* | (2026.01) |
| *H10W 70/09* | (2026.01) |
| *H10W 74/01* | (2026.01) |
| *H10W 74/47* | (2026.01) |
| *H10W 74/40* | (2026.01) |

(52) U.S. Cl.
CPC .......... *H10W 74/114* (2026.01); *H10W 70/09* (2026.01); *H10W 74/01* (2026.01); *H10W 74/47* (2026.01); *H10W 74/40* (2026.01)

(58) Field of Classification Search
None
See application file for complete search history.

(56) References Cited

U.S. PATENT DOCUMENTS

| | | | | |
|---|---|---|---|---|
| 2001/0026017 A1* | 10/2001 | Seto | ..................... | H03H 1/0007 |
| | | | | 257/736 |
| 2003/0007314 A1* | 1/2003 | Sanada | .................. | H01G 4/248 |
| | | | | 361/308.1 |

FOREIGN PATENT DOCUMENTS

| | | |
|---|---|---|
| JP | H09-270325 A | 10/1997 |
| JP | 2002-289464 A | 10/2002 |
| JP | 2004-235495 A | 8/2004 |
| JP | 4821302 B2 | 9/2011 |
| JP | 2013-098540 A | 5/2013 |
| JP | 6538008 B2 | 6/2019 |
| JP | 2019-129478 A | 8/2019 |

OTHER PUBLICATIONS

International Search Report for PCT/JP2021/036635 dated Jan. 11, 2022.

* cited by examiner

*Primary Examiner* — Nicholas J Tobergte
(74) *Attorney, Agent, or Firm* — McDonald Hopkins LLC

(57) ABSTRACT

An electronic component includes a plurality of laminated insulating layers, one or more surface conductors formed on a surface of the insulating layer, and an internal conductor formed at a boundary portion between the adjacent insulating layers. A thickness of the surface conductor is larger than a thickness of a thinnest layer of the insulating layers and larger than a thickness of the internal conductor.

19 Claims, 15 Drawing Sheets

ELECTRONIC COMPONENT AND METHOD FOR FORMING RESIN LAYER ON ELECTRONIC COMPONENT

CROSS REFERENCE TO RELATED APPLICATION

This is a continuation of International Application No. PCT/JP2021/036635 filed on Oct. 4, 2021 which claims priority from Japanese Patent Application No. 2020-210171 filed on Dec. 18, 2020. The contents of these applications are incorporated herein by reference in their entireties.

BACKGROUND OF THE DISCLOSURE

Field of the Disclosure

The present disclosure relates to an electronic component in which an insulating layer is laminated, and a resin layer forming method for the electronic component.

Description of the Related Art

Conventionally, as this type of electronic component, for example, an electronic component described in Patent Document 1 (Japanese Patent No. 4821302) is known. In the electronic component described in Patent Document 1, ceramic insulating layers and conductive layers are alternately laminated. A conductor on which an inductor pattern and a land pattern are formed is provided in the uppermost conductive layer.

Patent Document 1: Japanese Patent No. 4821302

BRIEF SUMMARY OF THE DISCLOSURE

In such an electronic component, electrical characteristics of an element or the like, for example, an electrical characteristic of an inductor formed by a wiring pattern provided in the electronic component changes according to at least a thickness and a width of a conductor forming the wiring pattern. Therefore, in the uppermost conductive layer, it is conceivable to change the thickness and width of the conductor by trimming to adjust the electrical characteristics of an element or the like. However, in the electronic component described in Patent Document 1, the conductor is thin because the conductor is formed by screen printing, photolithography, a thin film method, or the like. Therefore, it is difficult to trim the conductor. Even if the conductor can be trimmed, the trimmable thickness of the conductor is small. Therefore, the electrical characteristics of an element or the like cannot be sufficiently adjusted.

Therefore, a possible benefit of the present disclosure is to solve the above problems, and to provide an electronic component having a large trimmable thickness of a conductor and a large adjustment range of electrical characteristics of an element or the like.

In order to solve the problem, an electronic component according to the present disclosure includes: a plurality of laminated insulating layers; one or more surface conductors formed on a surface of the insulating layer; and an internal conductor formed at a boundary portion between the adjacent insulating layers, in which a thickness of the surface conductor is larger than a thickness of a thinnest layer of the insulating layers and larger than a thickness of the internal conductor.

According to the present disclosure, it is possible to provide an electronic component having a large trimmable thickness of a conductor and a large adjustment range of electrical characteristics of an element or the like.

Figure 1:
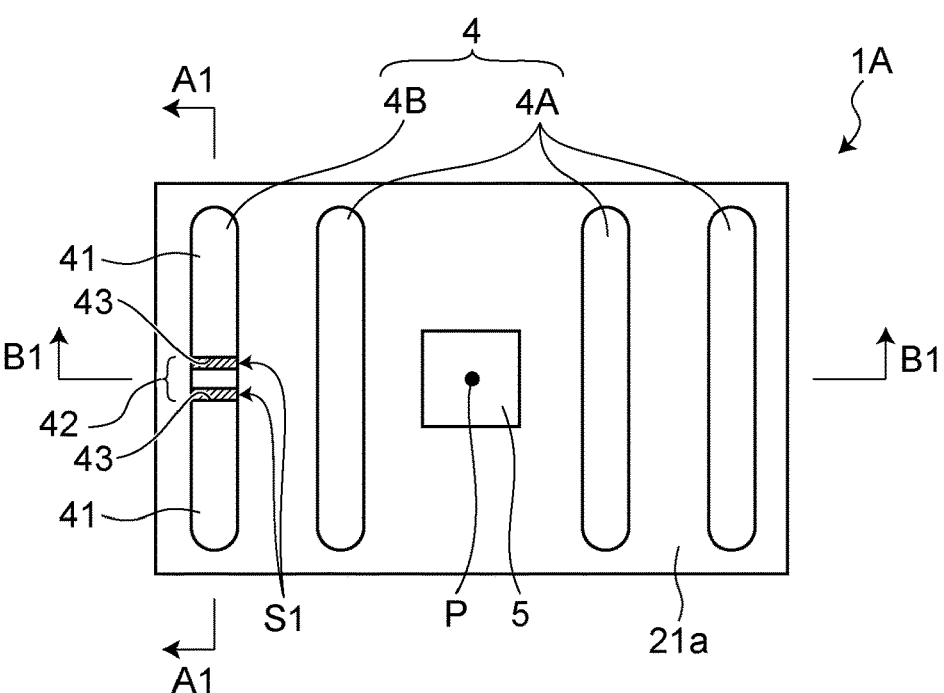
FIG. 1 is a plan view of an electronic component according to a first embodiment of the present disclosure, excluding a plating film.

DETAILED DESCRIPTION OF THE
DISCLOSURE

An electronic component according to one aspect of the present disclosure includes: a plurality of laminated insulating layers; one or more surface conductors formed on a surface of the insulating layer; and an internal conductor formed at a boundary portion between the adjacent insulating layers, in which a thickness of the surface conductor is larger than a thickness of a thinnest layer of the insulating layers and larger than a thickness of the internal conductor.

According to this configuration, the surface conductor can be largely trimmed in the thickness direction. As a result, the electrical characteristics of an element or the like including the surface conductor can be adjusted in a wide range.

In the conventional electronic component, when a first conductor requiring trimming and a second conductor not requiring trimming are mixed on a surface of an insulating layer, the thicknesses of the first conductor and the second conductor are almost the same. For this reason, it is difficult to trim only the first conductor by a planar processing method such as etching or surface grinding. On the other hand, according to the above configuration, it is possible to realize an electronic component in which the first conductor which is a surface conductor is thicker than the second conductor. In such an electronic component, since there is a difference in thickness between the first conductor and the second conductor, it is easy to trim only the first conductor by a planar processing method. Therefore, the manufacturing efficiency of the electronic component can be improved.

The thickness of the surface conductor may be larger than twice the thickness of the thinnest layer of the insulating layers.

According to this configuration, the trimmable thickness of the surface conductor can be increased as compared with a configuration in which the thickness of the surface conductor is smaller than twice the thickness of the thinnest layer of the insulating layers. Therefore, it is possible to realize an electronic component having a large adjustment range of electrical characteristics of an element or the like including a surface conductor.

In addition, the thickness of the surface conductor may be larger than the thickness of the thickest layer of the insulating layers.

According to this configuration, the trimmable thickness of the surface conductor can be increased as compared with the configuration in which the thickness of the surface conductor is smaller than the thickness of the thickest layer of the insulating layers. Therefore, it is possible to realize an electronic component having a large adjustment range of electrical characteristics of an element or the like including a surface conductor.

A plating film may be formed on at least a part of the surface of the surface conductor.

According to this configuration, by forming the plating film on at least a part of the surface of the surface conductor, the thickness of the conductor in which the surface conductor and the plating film are integrated can be increased. That is, the conductor can be not only thinned by trimming or the like, but also thickened. Therefore, it is possible to realize an electronic component having a large adjustment range of electrical characteristics of an element or the like including a surface conductor.

Further, the electronic component may include a plurality of connection conductors formed inside the insulating layer or on the surface of the insulating layer and electrically connected to the surface conductors, respectively.

According to this configuration, the surface conductor can form a wiring through which a signal is input from one connection conductor and output to the other connection conductor. In the wiring formed of the surface conductor, since the surface conductor is thick, a large conductor cross section can be obtained. This makes it possible to realize wiring capable of applying a large current without increasing the width of the surface conductor. In addition, the width of the surface conductor can be reduced while maintaining the conductor cross-sectional area. That is, it is possible to reduce the area occupied by the surface conductor on the surface of the insulating layer while maintaining the allowable current value of the wiring. Therefore, the electronic component can be downsized, and wiring, components, and the like can be further arranged.

At least one of the plurality of connection conductors may be a via conductor penetrating one of the plurality of insulating layers in a lamination direction of the insulating layers.

According to this configuration, the via conductor of the plurality of connection conductors is not exposed to the surface of the insulating layer. Therefore, it is possible to reduce members for suppressing the influence of atmosphere, moisture, and the like on the surface conductor. Therefore, since the number of members of the electronic component is reduced, the manufacturing efficiency of the electronic component can be improved.

In addition, the electronic component may include an inductor conductor electrically connected to the surface conductor via the connection conductor, and the surface conductor may constitute at least a part of the inductor together with the connection conductor and the inductor conductor.

According to this configuration, since the surface conductor is thick in at least a part of the inductor, a larger conductor cross section can be obtained. This reduces the insertion loss of the inductor. In addition, since the trimmable thickness of the surface conductor is large, the adjustment range of the electrical characteristics of the inductor is large.

In addition, the surface conductor may include a first portion that is thicker than the thickness of the thinnest layer of the insulating layers and is thicker than the thickness of the internal conductor, and a second portion that is continuous with the first portion along the surface of the insulating layer and is thinner than the first portion.

According to this configuration, there is a difference in thickness at a boundary portion between the first portion and the second portion, and a shadow is generated at the boundary portion. This shadow can be used as a directional mark indicating the direction of the electronic component. This eliminates the need to separately provide a directional mark, so that the manufacturing efficiency of the electronic component can be improved. In addition, since the area occupied by the directional mark is unnecessary on the surface of the insulating layer, it is possible to reduce the size of the electronic component and to further arrange wiring, components, and the like.

Further, the electronic component may have a rotationally symmetric outer shape in plan view, and a boundary portion between the first portion and the second portion in the surface conductor may be arranged in a non-rotationally symmetric manner with respect to a center point of the rotational symmetry of the electronic component.

According to this configuration, at least one shadow generated by the boundary portion between the first portion and the second portion in the surface conductor appears at a non-rotationally symmetric position with respect to the center point when the electronic component is viewed in plan view. Therefore, the shadow that can be used as a directional mark indicating the direction of the electronic component can be realized.

Further, the electronic component may have a rotationally symmetric outer shape in plan view, and the surface conductor may be arranged in a non-rotationally symmetric manner with respect to a center point of the rotational symmetry of the electronic component in plan view.

According to this configuration, the surface conductor can indicate the direction of the electronic component by its position and shape in plan view. That is, the surface conductor can also serve as a directional mark indicating the direction of the electronic component. This eliminates the need to separately provide a directional mark, so that the manufacturing efficiency of the electronic component can be improved. In addition, since the area occupied by the directional mark is unnecessary on the surface of the insulating layer, it is possible to reduce the size of the electronic component and to further arrange wiring, components, and the like.

The electronic component may include a resin layer or a glass layer covering at least a part of the surface conductor.

According to this configuration, at least a part of the surface conductor can be protected by the resin layer or the glass layer from the influence of foreign matter, impact, or the like from the outside. In addition, the resin layer or the glass layer improves the mechanical strength of the electronic component. Furthermore, it is possible to arrange a shield that shields electromagnetic waves at a position facing the electronic component via the resin layer or the glass layer.

At least a part of the resin layer or at least a part of the glass layer may be thicker than a thickness of a thinnest layer of the insulating layers and thicker than a thickness of the internal conductor.

According to this configuration, it is possible to realize a resin layer or a glass layer capable of more reliably protecting the surface conductor from the influence of foreign matter, impact, or the like from the outside and further improving the mechanical strength of the electronic component.

The electronic component may further include a via conductor penetrating one of the plurality of insulating layers in the lamination direction of the insulating layers, and the thickness of the surface conductor may be larger than a length of the via conductor in the lamination direction.

According to this configuration, the surface conductor can be largely trimmed in the thickness direction. As a result, the electrical characteristics of an element or the like including the surface conductor can be adjusted in a wide range.

In the conventional electronic component, when a first conductor requiring trimming and a second conductor not requiring trimming are mixed on a surface of an insulating layer, the thicknesses of the first conductor and the second conductor are almost the same. For this reason, it is difficult to trim only the first conductor by a planar processing method such as etching or surface grinding. On the other hand, according to the above configuration, it is possible to realize an electronic component in which the first conductor which is a surface conductor is thicker than the second conductor. In such an electronic component, since there is a difference in thickness between the first conductor and the second conductor, it is easy to trim only the first conductor by a planar processing method. Therefore, the manufacturing efficiency of the electronic component can be improved.

In addition, the surface conductor may include a first portion that is thicker than the length of the via conductor in the lamination direction, and a second portion that is continuous with the first portion along a surface of the insulating layer and is thinner than the first portion.

According to this configuration, there is a difference in thickness at a boundary portion between the first portion and the second portion, and a shadow is generated at the boundary portion. This shadow can be used as a directional mark indicating the direction of the electronic component. This eliminates the need to separately provide a directional mark, so that the manufacturing efficiency of the electronic component can be improved. In addition, since the area occupied by the directional mark is unnecessary on the surface of the insulating layer, it is possible to reduce the size of the electronic component and to further arrange wiring, components, and the like.

The surface conductor may constitute at least a part of the inductor.

According to this configuration, since the surface conductor is thick in at least a part of the inductor, a larger conductor cross section can be obtained. This reduces the insertion loss of the inductor. In addition, since the trimmable thickness of the surface conductor is large, the adjustment range of the electrical characteristics of the inductor is large.

A resin layer forming method for an electronic component according to an aspect of the present disclosure includes: an immersion step of immersing an electronic component not including a resin layer in a resin to attach the resin to an outer surface of the electronic component including a surface of the insulating layer; a curing step of curing the resin attached to at least a part of the surface conductor to form a resin layer; and a removal step of removing the uncured resin from the electronic component.

According to this method, the resin layer can be formed by attaching the resin to the entire electronic component and curing the resin only at a desired portion on the electronic component. Therefore, unlike the method for forming the resin layer by applying the resin only to a desired portion, it is not necessary to align the electronic components in order to attach the resin. Therefore, the manufacturing efficiency of the electronic component can be improved.

Hereinafter, embodiments of the present disclosure will be described with reference to the drawings. Note that the present disclosure is not limited to the following embodiments.

In the drawings, substantially the same elements are denoted by the same reference numerals, and description thereof is omitted.

Hereinafter, for convenience of description, terms indicating directions such as "upper surface", "lower surface", "upper side", "right side", and "left side" are used, but these terms are not intended to limit a usage state or the like of the electronic component according to the present disclosure.

First Embodiment

Figure 2:
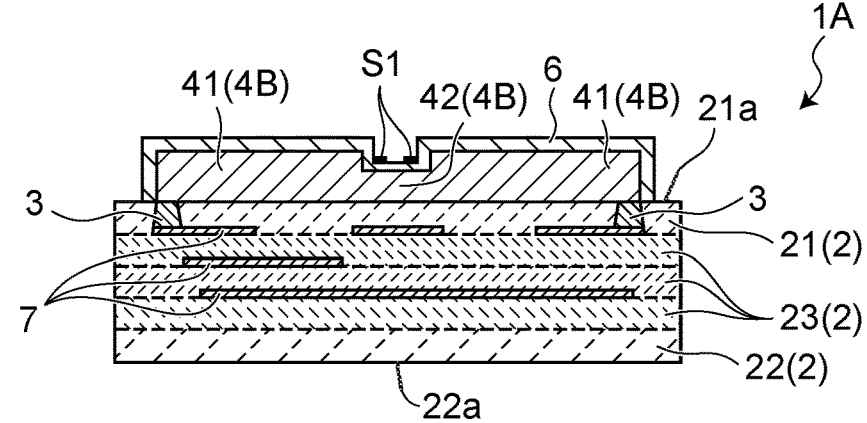
FIG. 2 is a cross-sectional view taken along line A1-A1 of the electronic component in FIG. 1.
Figure 3:
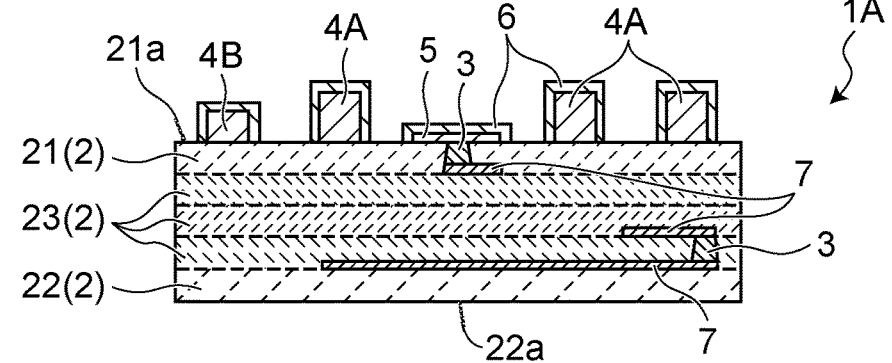
FIG. 3 is a cross-sectional view taken along line B1-B1 of the electronic component in FIG. 1.

An electronic component according to a first embodiment of the present disclosure will be described with reference to FIGS. 1 to 3. FIG. 1 is a plan view of an electronic component according to a first embodiment of the present disclosure, excluding a plating film. FIG. 2 is a cross-sectional view taken along line A1-A1 of the electronic component in FIG. 1. FIG. 3 is a cross-sectional view taken along line B1-B1 of the electronic component in FIG. 1.

As illustrated in FIGS. 2 and 3, in the first embodiment, an electronic component 1A includes five laminated insulating layers 2. The five insulating layers 2 include a first surface layer 21 constituting the upper surface of the electronic component 1A, a second surface layer 22 constituting the lower surface, and an intermediate layer 23 laminated between the first surface layer 21 and the second surface layer 22. In addition, the electronic component 1A includes via conductors 3 that penetrate one insulating layer 2. As illustrated in FIG. 1, a surface conductor 4 and a land conductor 5 are formed on a surface 21a of the first surface layer 21.

The insulating layer 2 illustrated in FIGS. 2 and 3 is formed, for example, by firing a sheet having a sinterable ceramic powder. The thickness of the insulating layer 2 is, for example, 1 to 150 μm. In the first embodiment and a second embodiment described later, the thicknesses of the five insulating layers 2 are the same.

The via conductor 3 is formed by firing a conductive paste having a conductive powder. The length of the via conductor 3 in the penetrating direction is the same as or substantially the same as the thickness of one insulating layer 2. The via conductor 3 has, for example, a truncated cone shape having a diameter of 20 to 200 μm.

As illustrated in FIGS. 1 to 3, the surface conductor 4 is formed on the surface 21a of the first surface layer 21. The surface conductor 4 is formed by firing a conductive paste having a conductive powder.

As illustrated in FIG. 2, two via conductors 3 formed in the first surface layer 21 are connected to both end portions of the surface conductor 4. These two via conductors 3 are an example of a "connection conductor" in the present disclosure. The via conductors 3 penetrate one of the laminated insulating layers 2 in the lamination direction of the insulating layers 2 (hereinafter, simply referred to as "lamination direction"). The electric signal applied to one via conductor 3 is transmitted to one end portion of the surface conductor 4, transmitted to the other end portion of the surface conductor 4, and output to the other via conductor 3. In this manner, the surface conductor 4 can function as wiring.

As illustrated in FIGS. 2 and 3, the thickness of the surface conductor 4 is larger than the length of the via conductor 3 in the penetrating direction. The thickness of the surface conductor 4 is, for example, 2 to 10 times the thickness of the insulating layer 2. The surface conductor 4 has, for example, a width of 20 to 200 μm and a length of 50 to 3000 μm. In the present embodiment, the surface conductor 4 has an elongated shape in which both end portions are rounded in plan view illustrated in FIG. 1.

As illustrated in FIG. 1, the surface conductor 4 includes surface conductors 4A having a constant or substantially constant thickness over the entire surface conductor 4A, and a surface conductor 4B having a partially different thickness.

As illustrated in FIG. 2, the surface conductor 4B includes a first portion 41 thicker than the length of the via conductor 3 in the penetrating direction, and a second portion 42 continuous with the first portion 41 along the surface 21a of the first surface layer 21 and thinner than the first portion 41. In such a surface conductor 4B, as illustrated in FIG. 1, shadows S1 are generated by a difference in thickness between the first portion 41 and the second portion 42. For example, the shadows S1 illustrated in FIG. 1 indicate shadows generated when the electronic component 1A is illuminated from slightly above both end portions of the surface conductor 4.

The surface conductor 4A and the first portion 41 of the surface conductor 4B can be trimmed in the thickness direction by a planar processing method after formation. Examples of the planar processing method include etching and surface grinding.

As illustrated in FIGS. 1 and 3, the land conductor 5 for connecting to another electronic component or the like is provided on the surface 21a of the first surface layer 21. In the present embodiment, the land conductor 5 is formed to be thinner than the second portion 42 of the surface conductor 4B.

As illustrated in FIGS. 2 and 3, a plating film 6 is formed on the surfaces of the surface conductor 4 and the land conductor 5. The plating film 6 suppresses the influence of atmosphere, moisture, and the like on the surface conductor 4 and the land conductor 5. The plating film 6 is, for example, a Ni—Sn plating film, a Ni-electroless Au plating film, or the like.

Note that the plating film 6 is formed as necessary, and may be formed only on a part of the surface conductor 4 or the land conductor 5, or may not be formed, for example.

As illustrated in FIGS. 2 and 3, an internal conductor 7 extending in a direction in which the insulating layer 2 extends is formed at a boundary portion between the plurality of insulating layers 2. The thickness of the internal conductor 7 is, for example, 2 to 10 μm.

As illustrated in FIG. 1, the electronic component 1A has a rotationally symmetric outer shape with respect to a virtual center point P of the electronic component 1A in plan view. Here, "rotationally symmetric" means that the relative position and the shape with respect to the virtual center point P coincide with those before rotation when the electronic component 1A is rotated around the virtual center point P in plan view. In the present embodiment, the outer shape of the electronic component 1A is rectangular. In this case, when the electronic component 1A is rotated by 180 degrees around the virtual center point P in plan view, the relative position and the shape of the electronic component 1A with respect to the virtual center point P coincide with those before the rotation. Therefore, the outer shape of the electronic component 1A in the present embodiment is rotationally symmetric.

The surface conductor 4 and the land conductor 5 are arranged rotationally symmetrically with respect to the virtual center point P on the surface 21a of the first surface layer 21. Therefore, the direction of the electronic component 1A cannot be determined from the outer shape of the electronic component 1A in plan view and the shapes and positions of the surface conductor 4 and the land conductor 5.

However, in the present embodiment, the direction of the electronic component 1A can be determined in plan view by the shadows S1 caused by the difference in thickness in the surface conductor 4B. In the present embodiment, the surface conductor 4B is arranged on the left side of the virtual center point P in the plan view illustrated in FIG. 1. On the other hand, the surface conductor 4B is not arranged on the right side of the virtual center point P in the plan view illustrated in FIG. 1. Therefore, when the electronic component 1A is viewed in plan view, the shadows S1 are seen only on the left side of the virtual center point P. Therefore, the direction of the electronic component 1A can be determined from the position of the shadow S1 in plan view. That is, the shadow S1 can be used as a directional mark indicating the direction of the electronic component 1A depending on the position in the plan view. In addition, since the visibility of the shadow S1 is improved by illuminating the electronic component 1A, it is easier to determine the direction of the electronic component 1A.

The shadow S1 occurs at a boundary portion 43 between the first portion 41 and the second portion 42 of the surface conductor 4B. As described above, in the present embodiment, the surface conductor 4B having the boundary portion 43 is arranged only on the left side of the virtual center point P in the plan view illustrated in FIG. 1. Therefore, when the boundary portion 43 is rotated around the virtual center point P in plan view, the relative position and the shape of the boundary portion 43 with respect to the virtual center point P do not coincide with those before and after the rotation. That is, the boundary portion 43 is arranged in a non-rotationally symmetric manner with respect to the virtual center point P. Therefore, the shadow S1 can be used as a directional mark.

Note that the mode in which the boundary portion 43 is arranged in a non-rotationally symmetric manner with respect to the virtual center point P is not limited to the above-described mode. As long as the boundary portion 43 is arranged in a non-rotationally symmetric manner with respect to the virtual center point P, the shadow S1 can be used as a directional mark regardless of the number of surface conductors 4B and the number of boundary portions 43 formed on each surface conductor 4B. For example, even when the electronic component 1A has two boundary portions 43 arranged on both left and right sides of the virtual center point P in the plan view illustrated in FIG. 1, at least one of the shapes of the two boundary portions 43 and the relative positions with respect to the virtual center point P only needs to be different from each other. In this case, when one boundary portion 43 is rotated around the virtual center point P, the one boundary portion 43 does not overlap the other boundary portion 43 so as to coincide with the other boundary portion 43. That is, the two boundary portions 43 are arranged in a non-rotationally symmetric manner with respect to the virtual center point P.

According to the electronic component 1A according to the present embodiment, the thickness of the surface conductor 4 is larger than the length of the via conductor 3 in the lamination direction. Therefore, the surface conductor 4 can be largely trimmed in the thickness direction. As a result, the electrical characteristics of an element or the like including the surface conductor 4 can be adjusted in a wide range.

In the conventional electronic component, when a first conductor requiring trimming and a second conductor not requiring trimming are mixed on a surface of an insulating layer, the thicknesses of the first conductor and the second conductor are almost the same. For this reason, it is difficult to trim only the first conductor by a planar processing method such as etching or surface grinding. On the other hand, according to the electronic component 1A according to the present embodiment, it is possible to realize the electronic component 1A in which the surface conductor 4 is thicker than the land conductor 5. In such an electronic component 1A, since there is a difference in thickness between the surface conductor 4 and the land conductor 5, it is easy to trim only the surface conductor 4 by a planar processing method. Therefore, the manufacturing efficiency of the electronic component 1A can be improved.

In addition, the electronic component 1A according to the present embodiment includes a plurality of via conductors 3 each electrically connected to the surface conductor 4. As a result, the surface conductor 4 can form a wiring through which a signal is input from one via conductor 3 and a signal is output to the other via conductor 3. In the wiring formed of the surface conductor 4, since the surface conductor 4 is thick, a large conductor cross section can be obtained. This makes it possible to realize wiring capable of applying a large current without increasing the width of the surface conductor 4. In addition, the width of the surface conductor 4 can be reduced while maintaining the conductor cross-sectional area. That is, it is possible to reduce the area occupied by the surface conductor 4 on the surface 21a of the insulating layer 2 while maintaining the allowable current value of the wiring. Therefore, the electronic component 1A can be downsized, and wiring, components, and the like can be further arranged.

In addition, according to the electronic component 1A according to the present embodiment, the via conductor 3 among the plurality of connection conductors is not exposed on the surface 21a of the insulating layer 2. Therefore, it is possible to reduce members for suppressing the influence of atmosphere, moisture, and the like on the surface conductor 4. Therefore, since the number of members of the electronic component 1A is reduced, the manufacturing efficiency of the electronic component 1A can be improved.

In addition, according to the electronic component 1A according to the present embodiment, the surface conductor 4 includes the first portion 41 thicker than the length of the via conductor 3 in the lamination direction, and the second portion 42 continuous with the first portion 41 along the surface 21a of the insulating layer 2 and thinner than the first portion 41. At this time, there is a difference in thickness at the boundary portion 43 between the first portion 41 and the second portion 42, and the shadow S1 is generated at the boundary portion 43. The shadow S1 can be used as a directional mark indicating the direction of the electronic component 1A. This eliminates the need to separately provide a directional mark, so that the manufacturing efficiency of the electronic component 1A can be improved. In addition, since the area occupied by the directional mark is unnecessary on the surface 21a of the insulating layer 2, it is possible to reduce the size of the electronic component 1A and to further arrange wiring, components, and the like.

In addition, according to the electronic component 1A according to the present embodiment, the boundary portion 43 between the first portion 41 and the second portion 42 in the surface conductor 4 is arranged in a non-rotationally symmetric manner with respect to the center point P of the rotational symmetry of the electronic component 1A. As a result, at least one shadow S1 generated by the boundary portion 43 appears at a non-rotationally symmetric position with respect to the center point P when the electronic component 1A is viewed in plan view. Therefore, the shadow S1 that can be used as a directional mark indicating the direction of the electronic component 1A can be realized.

Second Embodiment

Figure 4:
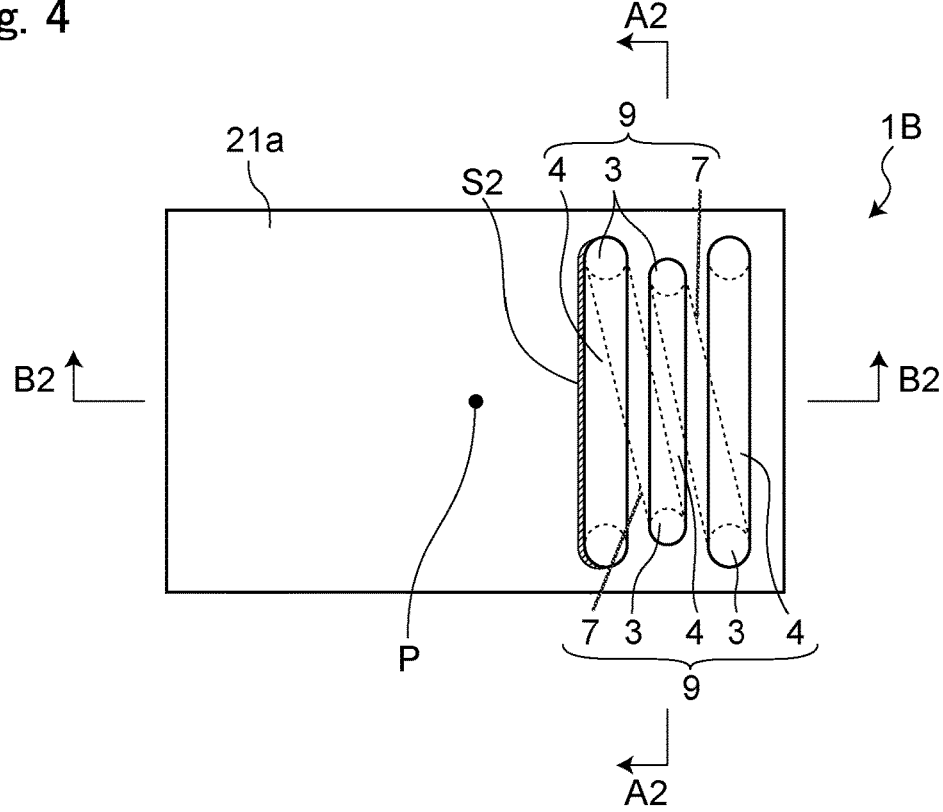
FIG. 4 is a plan view of an electronic component according to a second embodiment of the present disclosure, excluding a resin layer.
Figure 5:
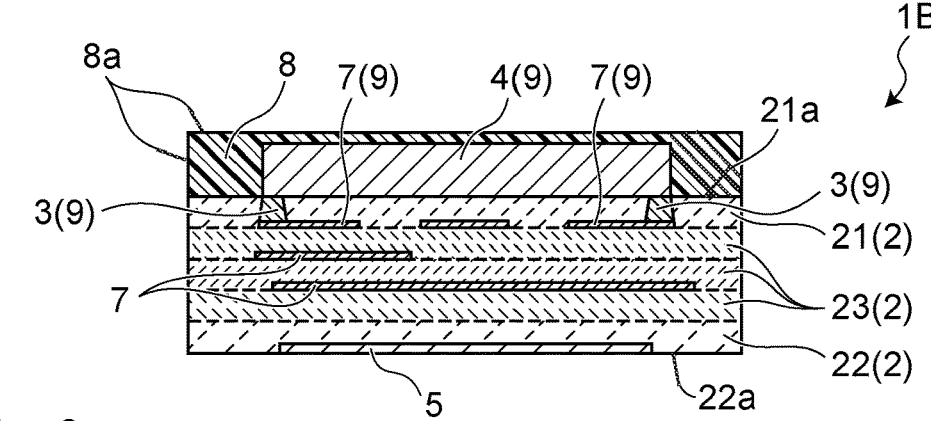
FIG. 5 is a cross-sectional view taken along line A2-A2 of the electronic component in FIG. 4.
Figure 6:
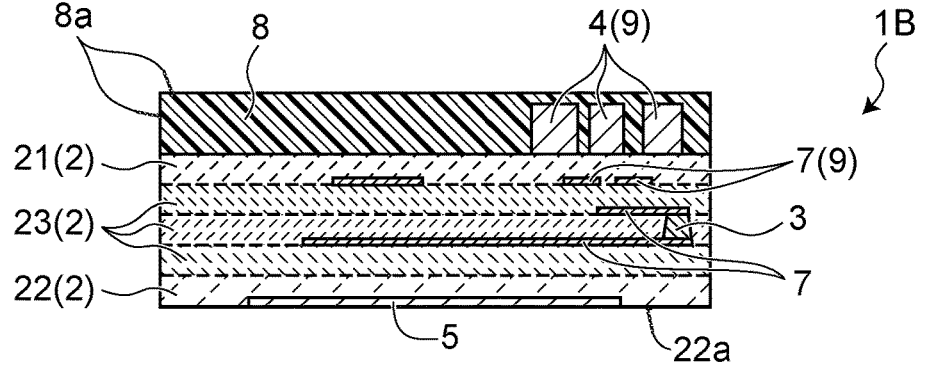
FIG. 6 is a cross-sectional view taken along line B2-B2 of the electronic component in FIG. 4.

Next, an electronic component according to a second embodiment of the present disclosure will be described with reference to FIGS. 4 to 6. FIG. 4 is a plan view of an electronic component according to the second embodiment of the present disclosure, excluding a resin layer. FIG. 5 is a cross-sectional view taken along line A2-A2 of the electronic component in FIG. 4. FIG. 6 is a cross-sectional view taken along line B2-B2 of the electronic component in FIG. 4.

An electronic component 1B according to the second embodiment is different from the electronic component 1A according to the first embodiment in that a surface conductor 4 constitutes a part of an inductor 9. As illustrated in FIG. 4, the surface conductor 4 is arranged in a non-rotationally symmetric manner with respect to a virtual center point P. As illustrated in FIGS. 5 and 6, the surface conductor 4 is covered with a resin layer 8. The land conductor 5 is formed on the surface 22a of the second surface layer 22.

In the second embodiment, as illustrated in FIG. 4, three surface conductors 4 are arranged in parallel to each other on a surface 21a of a first surface layer 21.

As illustrated in FIG. 4, the three surface conductors 4 are electrically connected via via conductors 3 connected to the end portions of the surface conductors 4 and two internal conductors 7. The two internal conductors 7 connect the via conductors 3 arranged on the opposite sides of the adjacent surface conductors 4. The via conductor 3 connected to the end portion of each surface conductor 4 is an example of a "connection conductor" in the present disclosure. The two internal conductors 7 are an example of an "inductor conductor" in the present disclosure.

As a result, the via conductors 3, the surface conductors 4, and the internal conductors 7 constitute the coil-shaped inductor 9. In the present embodiment, the winding axis direction of the inductor 9 is a direction perpendicular to the direction in which the insulating layer 2 spreads and the direction in which the surface conductor 4 extends (left-right direction in FIG. 4, and depth direction of the paper surface in FIG. 5).

As illustrated in FIG. 4, the electronic component 1B has a rotationally symmetric outer shape in plan view, similarly to the electronic component 1A. That is, when the electronic component 1B is rotated around the virtual center point P in plan view, the relative position and the shape with respect to the virtual center point P coincide with those before the rotation. On the other hand, in the present embodiment, the three surface conductors 4 are arranged only on the right side of the virtual center point P and are not arranged on the left side in the plan view illustrated in FIG. 4. Therefore, when the three surface conductors 4 are rotated around the virtual center point P in plan view, the relative positions and the shapes of the three surface conductors 4 with respect to the virtual center point P do not coincide with those before and after the rotation. That is, the surface conductors 4 are arranged in a non-rotationally symmetric manner with respect to the virtual center point P. Therefore, the direction of the electronic component 1B can be determined from the positions of the surface conductors 4 in plan view. Therefore, the surface conductors 4 can be used as directional marks indicating the direction of the electronic component 1B by their positions and shapes in plan view.

For example, as in the present embodiment, the surface conductors 4 can be used as directional marks when being arranged in a non-rotationally symmetric manner with respect to the virtual center point P in plan view. As long as such an arrangement is satisfied, one or a plurality of surface conductors 4 can indicate the direction of the electronic component 1B in plan view. For example, even when the surface conductors 4 are arranged on both the left and right sides of the virtual center point P in the plan view illustrated in FIG. 1, at least one of the shapes of the surface conductor 4 arranged on the right side and the surface conductor 4 arranged on the left side and the relative positions with respect to the virtual center point P only needs to be different. In this case, when the surface conductor 4 arranged on the right side is rotated around the virtual center point P, the surface conductor 4 arranged on the right side does not overlap the surface conductor 4 arranged on the left side so as to coincide with the surface conductor 4 arranged on the left side. That is, the surface conductors 4 arranged on the left and right sides are arranged in a non-rotationally symmetric manner with respect to the virtual center point P.

Further, since the surface conductor 4 is thick, when the electronic component 1B is illuminated, a clear shadow S2 is generated by the surface conductor 4. The shadow S2 occurs, for example, in a case where light can be transmitted through the resin layer 8 described later, in a case where the surface conductor 4 protrudes from the surface of the resin layer 8, in a case where the electronic component 1B does not include the resin layer 8, or the like. The shadow S2 illustrated in FIG. 4 indicates a shadow when the electronic component 1B including the resin layer 8 through which light can be transmitted is illuminated from diagonally upper right of the electronic component 1B. Note that such a shadow S2 occurs in each of the surface conductors 4, but FIG. 4 representatively illustrates only the shadow S2 of the surface conductor 4 closest to the virtual center point P. According to such a shadow S2, since the visibility of the surface conductor 4 in plan view is good, it is easy to determine the direction of the electronic component 1B.

As illustrated in FIGS. 5 and 6, the resin layer 8 that covers the surface conductor 4 is formed on the surface 21a of the first surface layer 21. For the resin layer 8, for example, an acrylic resin, a urethane resin, an epoxy resin, a phenol resin, a silicone resin, polyimide, or the like is used. In the present embodiment, the resin layer 8 is formed over the entire surface 21a of the first surface layer 21. In the present embodiment, the thickness of the resin layer 8 is larger than any of the length of the via conductor 3 in the penetrating direction, the thickness of each insulating layer 2, and the thickness of each internal conductor 7 in a portion not overlapping the surface conductor 4 in plan view. In the present embodiment, since the five insulating layers 2 have the same thickness, it can be said that the thickness of the portion of the resin layer 8 is larger than the thickness of the thinnest layer of the five insulating layers 2. Here, the thickness of the resin layer 8 refers to, for example, the thickness from the surface 21a of the first surface layer 21 to an outer surface 8a of the resin layer 8 in the lamination direction.

The resin layer 8 formed on the side of the surface conductor 4 prevents the surface conductor 4 from being peeled off from the surface 21a of the first surface layer 21 or from being displaced on the surface 21a. In addition, since the resin layer 8 is covered with the surface conductor 4, the influence of atmosphere, moisture, and the like on the surface conductor 4 is suppressed. Further, by forming the resin layer 8, the mechanical strength of the electronic component 1B can be improved. Furthermore, a shield (not illustrated) that shields electromagnetic waves can be provided on the outer surface 8a of the resin layer 8. By interposing the resin layer 8 between the shield and the surface conductor 4, it is possible to realize a shield that is not electrically connected to the surface conductor 4.

According to the electronic component 1B according to the present embodiment, the surface conductor 4 constitutes at least a part of the inductor 9 together with the via conductors 3 and the internal conductor 7. In at least a part of such an inductor 9, since the surface conductor 4 is thick, a larger conductor cross section can be obtained. This reduces the insertion loss of the inductor 9. In addition, since the trimmable thickness of the surface conductor 4 is large, the adjustment range of the electrical characteristics of the inductor 9 is large.

In addition, according to the electronic component 1B according to the present embodiment, the surface conductor 4 is arranged in a non-rotationally symmetric manner with respect to the center point P of the rotational symmetry of the electronic component 1B. Therefore, the direction of the electronic component 1B can be indicated by the position and shape of the surface conductor 4 in plan view. That is, the surface conductor 4 can also serve as a directional mark indicating the direction of the electronic component 1B. This eliminates the need to separately provide a directional mark, so that the manufacturing efficiency of the electronic component 1B can be improved. In addition, since the area occupied by the directional mark is unnecessary on the surface 21a of the insulating layer 2, it is possible to reduce the size of the electronic component 1B and to further arrange wiring, components, and the like.

In addition, according to the electronic component 1B according to the present embodiment, the electronic component 1B includes the resin layer 8 that covers at least a part of the surface conductor 4. The resin layer 8 can protect the surface conductor 4 from the influence of foreign matter, impact, or the like from the outside. In addition, the resin layer 8 improves the mechanical strength of the electronic component 1B. Furthermore, a shield that shields electromagnetic waves can be arranged at a position facing the electronic component 1B via the resin layer 8.

In addition, according to the electronic component 1B according to the present embodiment, a part of the resin layer 8 is thicker than the thickness of the thinnest layer of the insulating layers 2 and thicker than the thickness of the internal conductor 7. As a result, it is possible to realize the resin layer 8 capable of more reliably protecting the surface conductor 4 from the influence of foreign matter, impact, or the like from the outside and further improving the mechanical strength of the electronic component 1B.

Third Embodiment

Figure 7:
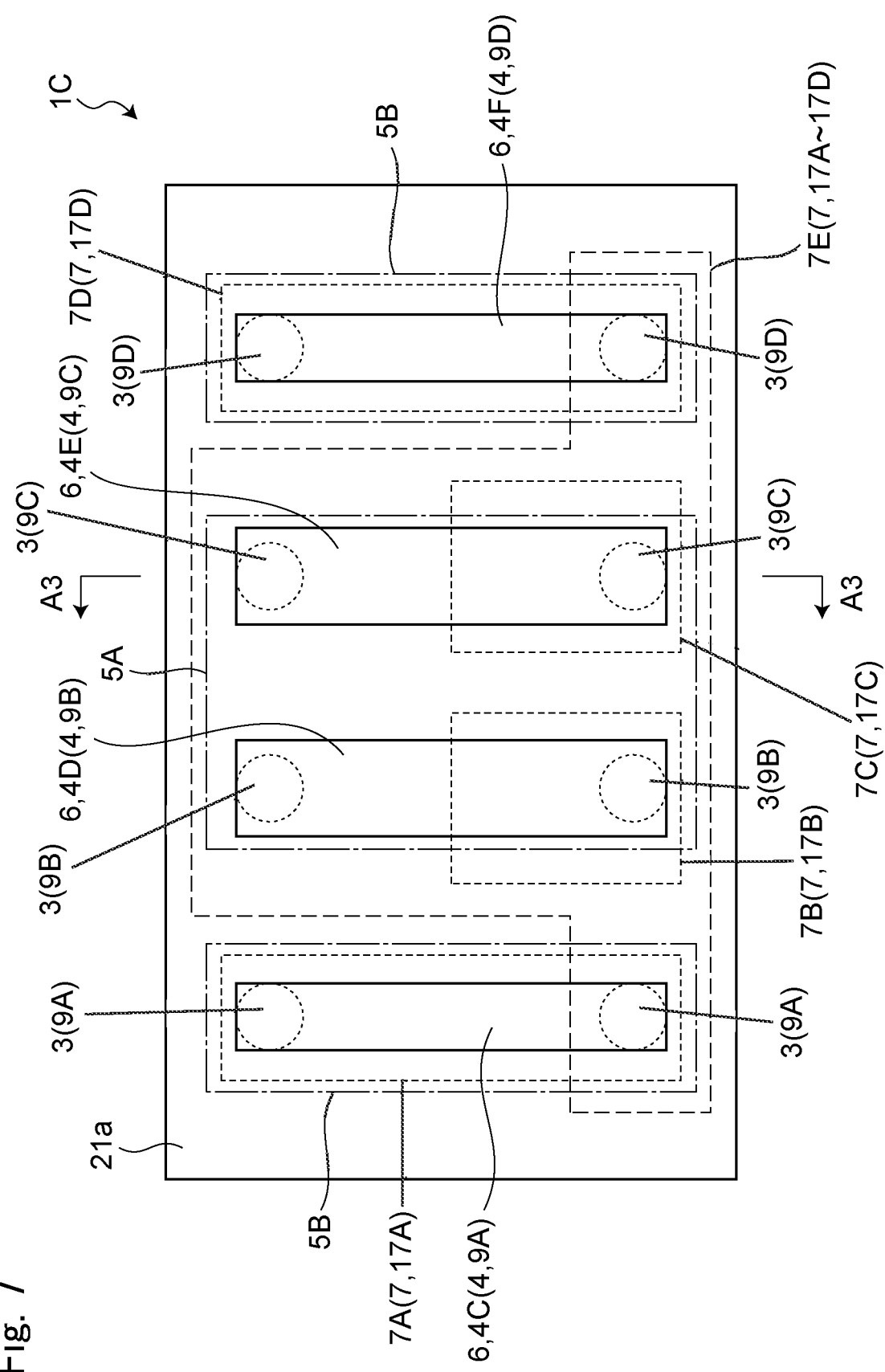
FIG. 7 is a plan view of the electronic component according to a third embodiment of the present disclosure.
Figure 8:
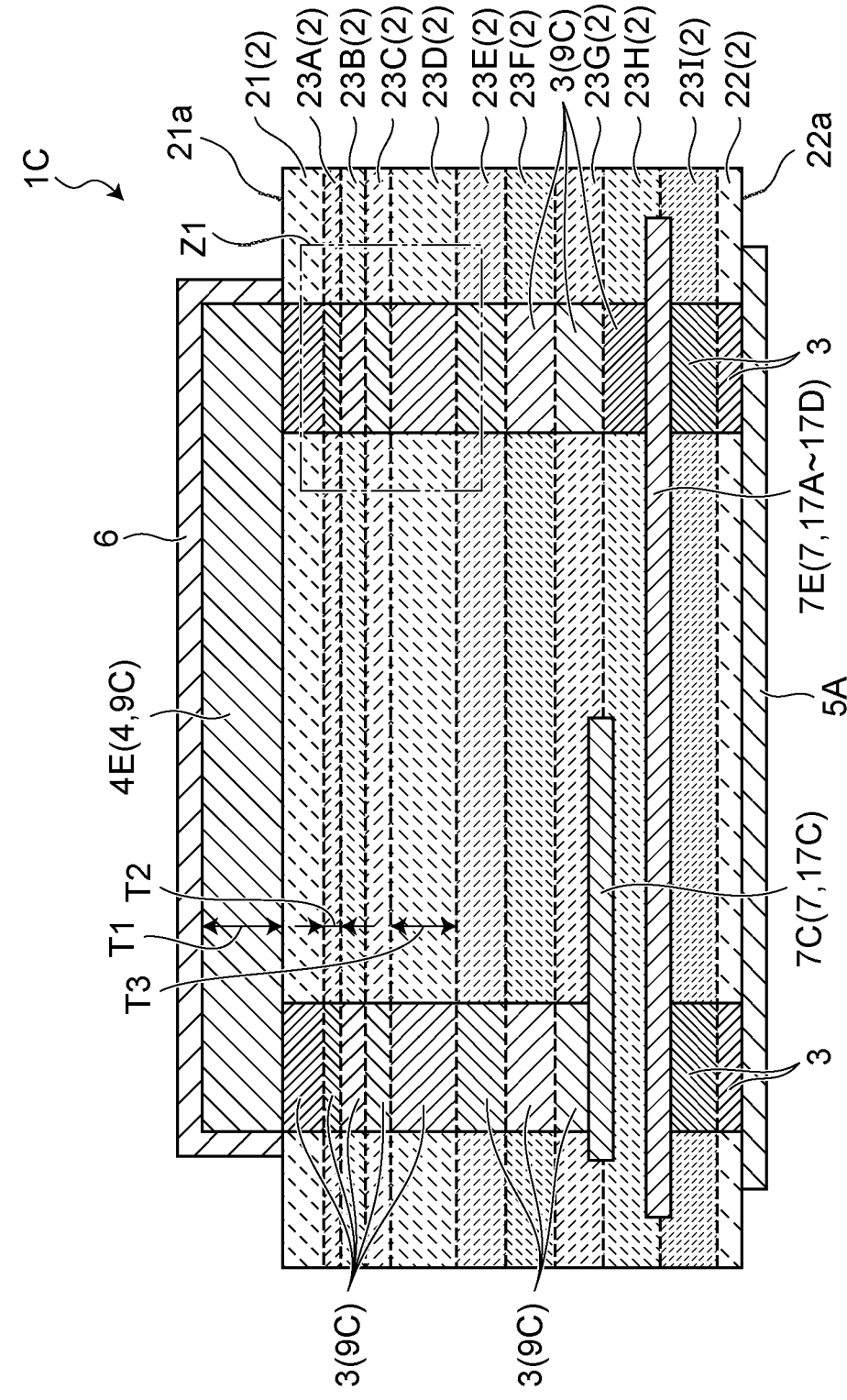
FIG. 8 is a cross-sectional view taken along line A3-A3 of the electronic component in FIG. 7.
Figure 9:
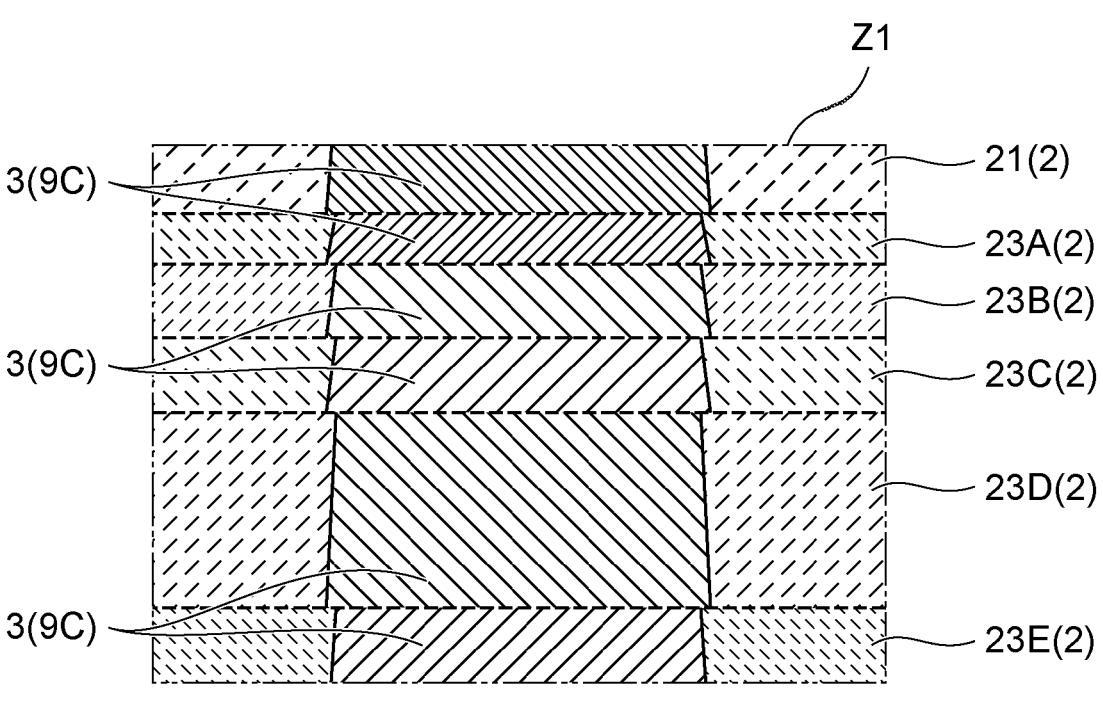
FIG. 9 is an enlarged view of a Z1 region in FIG. 8.

Next, an electronic component according to a third embodiment of the present disclosure will be described with reference to FIGS. 7 to 9. FIG. 7 is a plan view of the electronic component according to the third embodiment of the present disclosure. FIG. 8 is a cross-sectional view taken along line A3-A3 of the electronic component in FIG. 7. FIG. 9 is an enlarged view of a Z1 region in FIG. 8.

As illustrated in FIG. 7, the electronic component 1C according to the third embodiment has a substantially rectangular outer shape when viewed from the lamination direction.

As illustrated in FIG. 8, the electronic component 1C includes eleven laminated insulating layers 2. The eleven insulating layers 2 include a first surface layer 21 constituting the upper surface of the electronic component 1C, a second surface layer 22 constituting the lower surface, and nine intermediate layers 23A to 23I laminated between the first surface layer 21 and the second surface layer 22.

The thicknesses of the insulating layers 2 in the lamination direction may be the same as or different from each other. In the example illustrated in FIG. 8, the intermediate layer 23A is the thinnest among the eleven insulating layers 2. The thickness T2 of the intermediate layer 23A is, for example, 5 μm. The intermediate layer 23D is the thickest among the eleven insulating layers 2. The thickness T3 of the intermediate layer 23D is, for example, 40 μm.

As indicated by an alternate long and short dash line in FIG. 7, one land conductor 5A functioning as a ground electrode and two land conductors 5B functioning as an input electrode or an output electrode are provided on a surface 22a (see FIG. 8) of the second surface layer 22. In the example illustrated in FIG. 7, the land conductor 5A is arranged at the center in the long-side direction (the left-right direction in FIG. 7) of the outer shape of the electronic component 1C when viewed from the lamination direction. The two land conductors 5B are arranged so as to sandwich the land conductor 5A in the long-side direction.

Four surface conductors 4 are arranged on the surface 21a of the first surface layer 21. The four surface conductors 4 include surface conductors 4C to 4E. Each of the surface conductors 4 extends in the short-side direction (up-down direction in FIG. 7) of the outer shape of the electronic component 1C when viewed from the lamination direction. As illustrated in FIG. 8, a plating film 6 is formed on the surface of the surface conductor 4.

In the example illustrated in FIG. 8, similarly to the surface conductor 4A in the first embodiment, the surface conductor 4 has a constant or substantially constant thickness over the entire surface conductor 4. The thickness T1 of the surface conductor 4 is larger than the thickness T2 of the intermediate layer 23A and larger than the thickness of an internal conductor 7 (described later). For example, the thickness T1 of the surface conductor 4 is larger than the thickness of the thickest internal conductor 7 included in the electronic component 1C. In the present embodiment, the thickness of the surface conductor 4 is larger than twice the thickness T2 of the intermediate layer 23A and larger than the thickness T3 of the intermediate layer 23D. In addition, the thickness of the surface conductor 4 may be larger than twice the thickness T3 of the intermediate layer 23D. Here, the "thickness of the surface conductor 4" does not include the thickness of the plating film 6 formed on the surface of the surface conductor 4. The thickness of the surface conductor 4 is, for example, 50 μm.

In the example illustrated in FIG. 7, the plating film 6 is formed on the entire surface of each surface conductor 4. The plating film 6 may be formed only on a part of the surface of the surface conductor 4. The thickness of the plating film 6 is, for example, 5 to 20 μm.

The surface conductor 4 and the plating film 6 constitute an integrated conductor. Therefore, the current flowing through the surface conductor 4 also flows through the plating film 6.

As indicated by a broken line in FIG. 7, the electronic component 1C includes five internal conductors 7. The five internal conductors 7 include internal conductors 7A to 7E. The internal conductors 7 are formed at boundary portions between the adjacent insulating layers 2. Each of the internal conductors 7A and 7D is electrically connected to each of the land conductors 5B. As illustrated in FIG. 8, the internal conductor 7E is connected to the land conductor 5A via the plurality of via conductors 3. Since the land conductor 5A is grounded, the internal conductor 7E is grounded. Note that the internal conductor 7E only needs to be electrically connected to the land conductor 5A, and may be connected to the land conductor 5A via a component other than the via conductors 3.

As illustrated in FIG. 7, the four internal conductors 7A to 7D are arranged so as not to face each other in the lamination direction. That is, the four internal conductors 7A to 7D do not overlap when viewed from the lamination direction. On the other hand, the internal conductor 7E is arranged so as to face the internal conductors 7A to 7D with the insulating layer 2 interposed therebetween in the lamination direction (see, for example, FIG. 8.). As a result, capacitors 17A to 17D are formed by the internal conductors 7A to 7D and the internal conductor 7E, respectively. The internal conductor 7A and the internal conductor 7D face an internal conductor (not illustrated) via the insulating layer 2 to form capacitive coupling.

As illustrated in FIG. 8, the internal conductor 7C is connected to the surface conductor 4E via eight via conductors 3 penetrating the first surface layer 21 and the seven intermediate layers 23A to 23G. The internal conductor 7E is connected to the surface conductor 4E via nine via conductors 3 penetrating the first surface layer 21 and the eight intermediate layers 23A to 23H. Note that the internal conductor 7C and the surface conductor 4E and the internal conductor 7E and the surface conductor 4E may be connected via one or a plurality of via conductors 3.

In the example illustrated in FIG. 8, the plurality of via conductors 3 connecting the internal conductors 7C and 7E and the surface conductor 4E are continuously arranged in the lamination direction as so-called continuous vias. In the example illustrated in FIG. 9, each via conductor 3 in the continuous vias has a tapered shape when viewed from a direction orthogonal to the lamination direction. In this case, each via conductor 3 has a truncated cone shape. Each via conductor 3 is not limited to the truncated cone shape, and may have, for example, a cylindrical shape.

Similarly to the surface conductor 4E, each of the surface conductors 4C, 4D, and 4F is connected to each of the internal conductors 7A, 7B, and 7D via the via conductor 3. Each of the surface conductors 4C, 4D, and 4F is connected to the internal conductor 7E via the via conductor 3. Note that the surface conductors 4C to 4F and the internal conductors 7A to 7D or the internal conductor 7E only need to be electrically connected, and may be connected via a component other than the via conductor 3.

The surface conductor 4E and the via conductor 3 connecting the surface conductor 4E and each of the internal conductors 7C and 7E constitute an inductor 9C. Similarly, the surface conductors 4C, 4D, and 4F and the via conductor 3 connecting the surface conductors 4C, 4D, and 4F and the internal conductors 7A, 7B, 7D, and 7E constitute inductors 9A, 9B, and 9D, respectively. That is, each of the surface conductors 4C to 4F constitutes a part of each of the inductors 9A to 9D. The via conductor 3 connected to each of the surface conductors 4C to 4F is an example of a "connection conductor" in the present disclosure.

Each of the inductors 9A to 9D and each of the capacitors 17A to 17D form an LC parallel resonator in which one inductor and one capacitor are connected in parallel. That is, the electronic component 1C includes four LC parallel resonators. The four LC parallel resonators are arranged along the long-side direction of the outer shape of the electronic component 1C when viewed from the lamination direction. Therefore, when the adjacent LC parallel resonators are electromagnetically coupled, the electronic component 1C functions as a band pass filter.

According to the electronic component 1C according to the present embodiment, the thickness of the surface conductor 4 is larger than the thickness of the thinnest intermediate layer 23A of the insulating layers 2 and larger than the thickness of the internal conductor 7. Therefore, the surface conductor 4 can be largely trimmed in the thickness direction. As a result, the electrical characteristics of the inductors 9A to 9D including the surface conductor 4 can be adjusted in a wide range.

In the electronic component 1C according to the present embodiment, the thickness of the surface conductor 4 is larger than twice the thickness of the thinnest intermediate layer 23A of the insulating layers 2. Therefore, the trimmable thickness of the surface conductor 4 can be increased as compared with a configuration in which the thickness of the surface conductor 4 is smaller than twice the thickness of the thinnest intermediate layer 23A of the insulating layers 2. Therefore, it is possible to realize the electronic component 1C having a large adjustment range of the electrical characteristics of the inductors 9A to 9D including the surface conductor 4.

In the electronic component 1C according to the present embodiment, the thickness of the surface conductor 4 is larger than the thickness of the thickest intermediate layer 23D of the insulating layers 2. Therefore, the trimmable thickness of the surface conductor 4 can be increased as compared with the configuration in which the thickness of the surface conductor 4 is smaller than the thickness of the thickest intermediate layer 23D of the insulating layers 2. Therefore, it is possible to realize the electronic component 1C having a large adjustment range of the electrical characteristics of the inductors 9A to 9D including the surface conductor 4.

In addition, according to the electronic component 1C according to the present embodiment, by forming the plating film 6 on at least a part of the surface of the surface conductor 4, the thickness of the conductor in which the surface conductor 4 and the plating film 6 are integrated can be increased. That is, the conductor can be not only thinned by trimming or the like, but also thickened. Therefore, it is possible to realize the electronic component 1C having a large adjustment range of the electrical characteristics of the inductors 9A to 9D including the surface conductor 4.

In the present embodiment, when the surface conductor 4 is trimmed and thinned, the conductor cross-sectional area of the surface conductor 4 decreases. At this time, the inductance values of the inductors 9A to 9D increase. As a result, the resonance frequency of the LC parallel resonator including the inductors 9A to 9D and the capacitors 17A to 17D decreases. On the other hand, when the plating film 6 is formed on the surface of the surface conductor 4, the conductor in which the surface conductor 4 and the plating film 6 are integrated becomes thick, so that the cross-sectional area of the conductor increases. Therefore, the inductance values of the inductors 9A to 9D are low contrary to the case where the surface conductor 4 becomes thin. As a result, the resonance frequency increases. In addition, the thickness of the conductor can be finely adjusted, for example, by changing the plating processing time. Therefore, the electrical characteristics of the inductor 9 including the surface conductor 4 can be adjusted with high accuracy.

Fourth Embodiment

Figure 10:
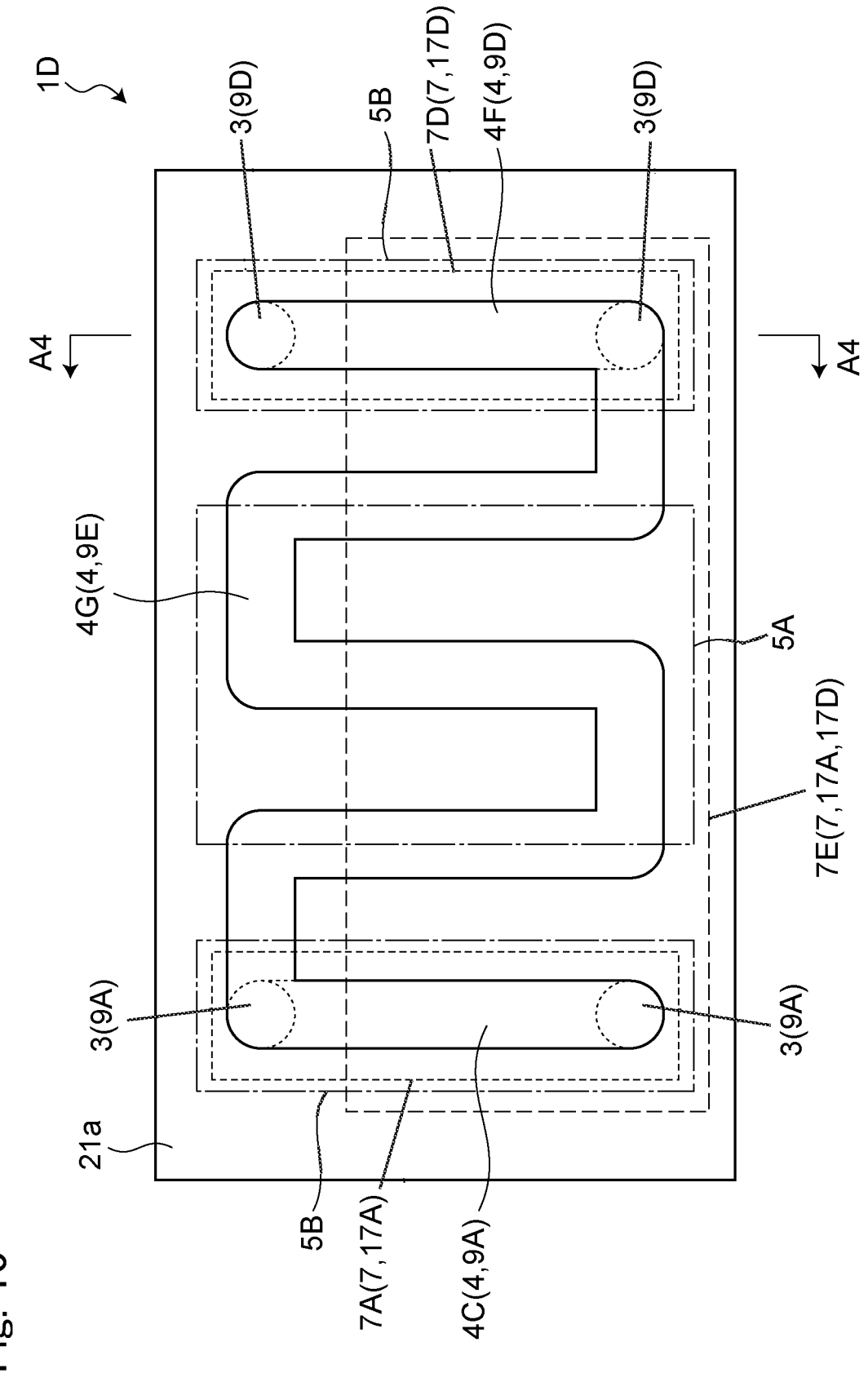
FIG. 10 is a plan view of an electronic component according to a fourth embodiment of the present disclosure.
Figure 11:
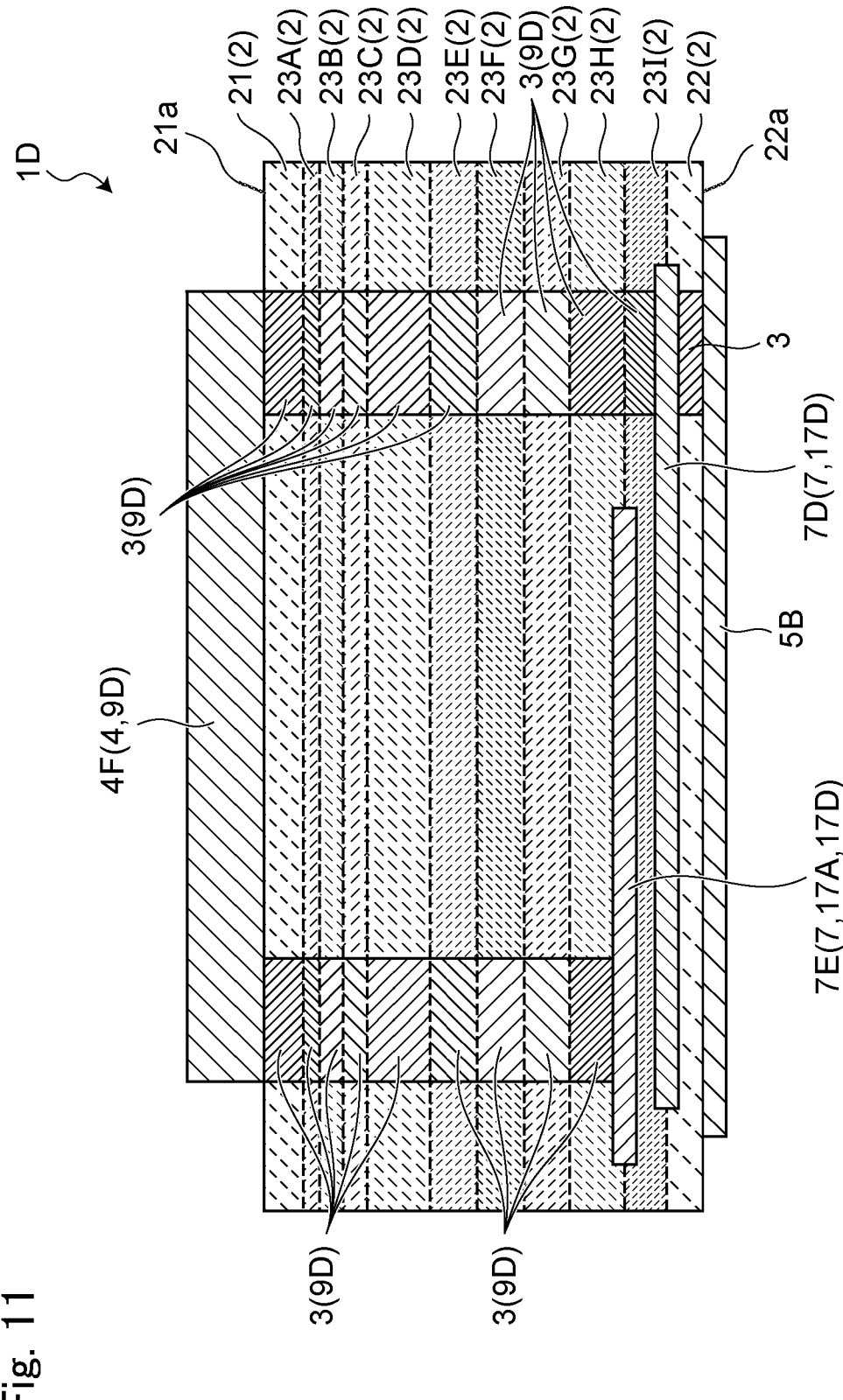
FIG. 11 is a cross-sectional view taken along line A4-A4 of the electronic component in FIG. 10.

Next, an electronic component according to a fourth embodiment of the present disclosure will be described with reference to FIGS. 10 and 11. FIG. 10 is a plan view of the electronic component according to the fourth embodiment of the present disclosure. FIG. 11 is a cross-sectional view taken along line A4-A4 of the electronic component in FIG. 10.

The electronic component 1D according to the fourth embodiment is different from the electronic component 1C according to the third embodiment in that a surface conductor 4G is further provided. In addition, the electronic component 1D does not include the surface conductors 4D and 4E and the internal conductors 7B and 7C. The plating film 6 is not formed on the surface of the surface conductor 4.

As illustrated in FIG. 10, the electronic component 1D includes three surface conductors 4 and three internal conductors 7. The three surface conductors include surface conductors 4C, 4F, and 4G. The three internal conductors 7 include internal conductors 7A, 7D, and 7E.

As illustrated in FIG. 11, the internal conductor 7D is connected to a land conductor 5B functioning as an input electrode or an output electrode via a via conductor 3 penetrating a second surface layer 22. The internal conductor 7E is connected to a land conductor 5A (see FIG. 10) to be grounded via two via conductors (not illustrated) penetrating an intermediate layer 23I and the second surface layer 22.

As illustrated in FIG. 11, the internal conductor 7D and the grounded internal conductor 7E are arranged so as to face each other in the lamination direction. Therefore, the internal conductors 7D and 7E function as a capacitor 17D. The surface conductor 4F is connected to the grounded internal conductor 7E via nine via conductors 3 penetrating a first surface layer 21 and eight intermediate layers 23A to 23H. The surface conductor 4F is connected to the internal conductor 7D via ten via conductors 3 penetrating the first surface layer 21 and nine intermediate layers 23A to 23I. The surface conductor 4F and the via conductor 3 connecting the surface conductor 4F and each of the internal conductors 7D and 7E constitute an inductor 9D. The inductor 9D and the capacitor 17D form an LC parallel resonator.

Similarly, the internal conductor 7A and the internal conductor 7E are arranged so as to face each other in the lamination direction, thereby functioning as the capacitor 17A. The surface conductor 4C is connected to each of the internal conductors 7A and 7E via the plurality of via conductors 3. The surface conductor 4C and the via conductor 3 connecting the surface conductor 4C and each of the internal conductors 7A and 7E constitute an inductor 9A. The inductor 9A and the capacitor 17A form an LC parallel resonator.

The via conductor 3 connected to each of the surface conductors 4C and 4F is an example of a "connection conductor" in the present disclosure.

As illustrated in FIG. 10, the surface conductor 4G is further provided on the surface 21a of the first surface layer 21. Both end portions of the surface conductor 4G are connected to the surface conductors 4C and 4F. The surface conductor 4G has a meander shape when viewed from the lamination direction. As a result, the surface conductor 4G functions as an inductor 9E. That is, the two LC parallel resonators are electromagnetically coupled and electrically connected by the inductor 9E.

According to the electronic component 1D according to the fourth embodiment, since the surface conductor 4 is thick in at least a part of the inductors 9A, 9D, and 9E, a larger conductor cross section can be obtained. This reduces the insertion loss of the inductors 9A, 9D, and 9E. In addition, since the trimmable thickness of the surface conductor 4 is large, the adjustment range of the electrical characteristics of the inductors 9A, 9D, and 9E is large.

Fifth Embodiment

Figure 12:
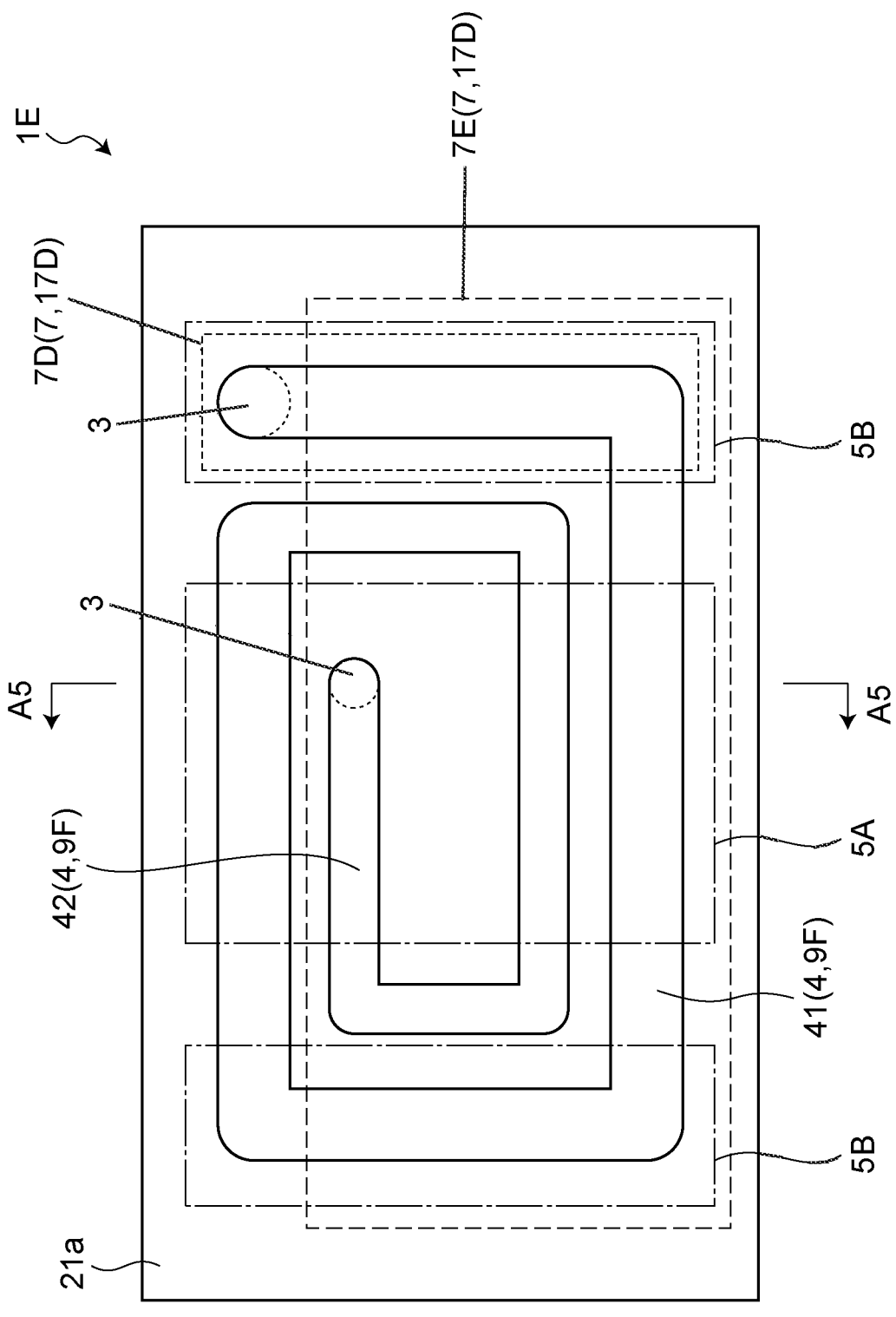
FIG. 12 is a plan view of an electronic component according to a fifth embodiment of the present disclosure.
Figure 13:
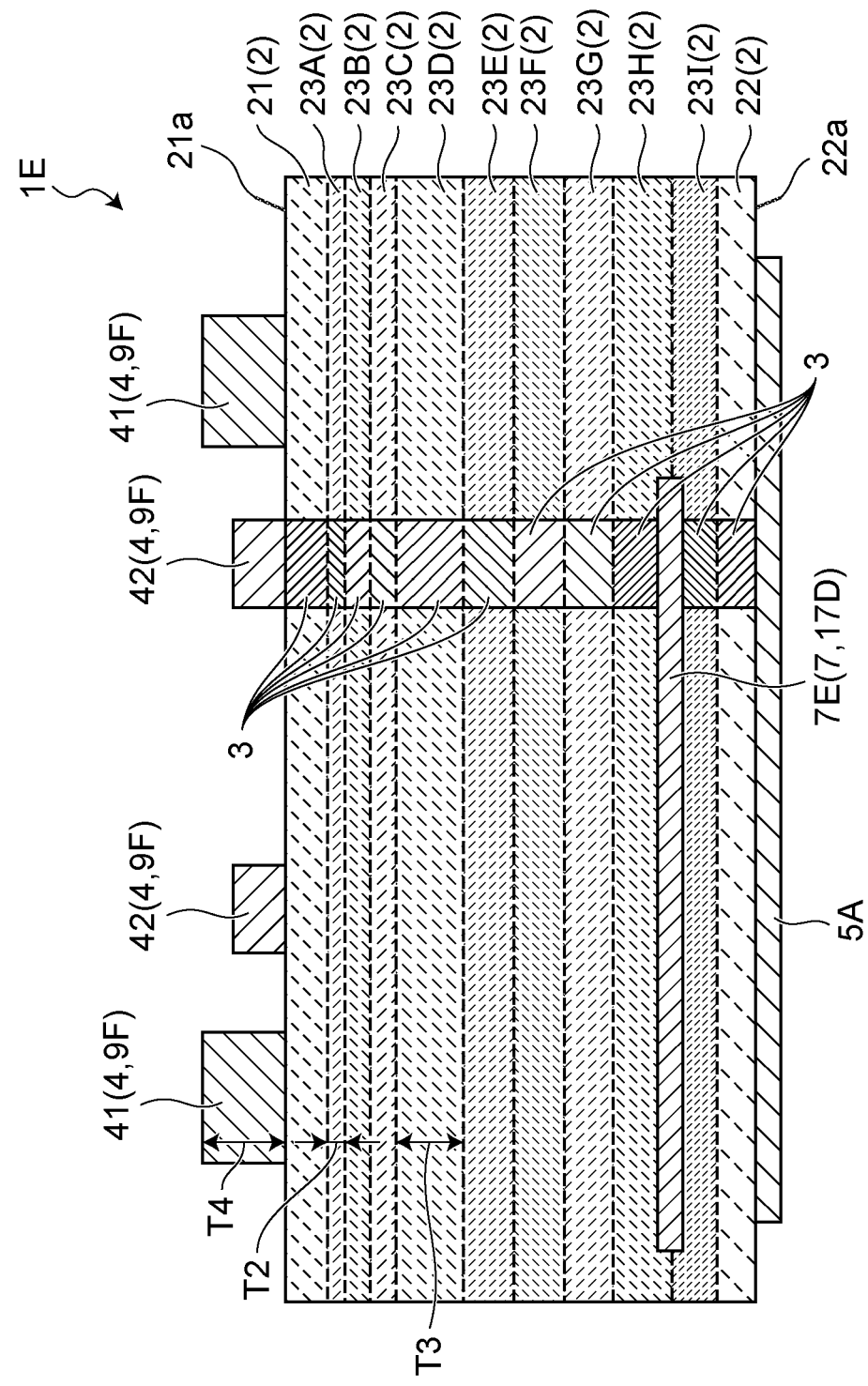
FIG. 13 is a cross-sectional view taken along line A5-A5 of the electronic component in FIG. 12.

Next, an electronic component according to a fifth embodiment of the present disclosure will be described with reference to FIGS. 12 and 13. FIG. 12 is a plan view of the electronic component according to the fifth embodiment of the present disclosure. FIG. 13 is a cross-sectional view of the electronic component taken along line A5-A5 in FIG. 12.

An electronic component 1E according to the fifth embodiment is different from the electronic component 1D according to the fourth embodiment in that a surface conductor 4 provided on a surface 21a of a first surface layer 21 has a spiral shape when viewed from the lamination direction.

As illustrated in FIG. 12, the electronic component 1E includes one surface conductor 4, an internal conductor 7D, and a grounded internal conductor 7E. Similarly to the electronic component 1D according to the fourth embodiment, the internal conductor 7D and the grounded internal conductor 7E face each other in the lamination direction to constitute a capacitor 17D.

The surface conductor 4 has a spiral shape when viewed from the lamination direction. That is, the surface conductor 4 is a coil whose winding axis direction is the lamination direction (the depth direction of the paper surface in FIG. 12), and constitutes an inductor 9F. As illustrated in FIG. 13, the inner end portion of the spiral shape of the surface conductor 4 is connected to the internal conductor 7E via the nine via conductors penetrating the first surface layer 21 and the eight intermediate layers 23A to 23H. The outer end portion of the spiral shape of the surface conductor 4 is connected to the internal conductor 7D via the plurality of via conductors 3 (see FIG. 12).

The via conductor 3 connected to the surface conductor 4 is an example of a "connection conductor" in the present disclosure.

As illustrated in FIG. 13, the surface conductor 4 includes a first portion 41 and a second portion 42 that is continuous with the first portion 41 along the surface 21a of the first surface layer 21 and is thinner in the lamination direction than the first portion 41. The thickness T4 of the first portion 41 is larger than the thickness T2 of the intermediate layer 23A and larger than the thickness of the internal conductor 7. For example, the thickness T4 of the first portion 41 is larger than the thickness of the thickest internal conductor 7 of the electronic component 1E. In the present embodiment, the thickness of the first portion 41 is larger than twice the thickness T2 of the intermediate layer 23A and larger than the thickness T3 of the intermediate layer 23D. In addition, the thickness of the first portion 41 may be thicker than twice the thickness T3 of the intermediate layer 23D.

In the present embodiment, as illustrated in FIG. 12, the width of the first portion 41 when viewed from the lamination direction is smaller than the width of the second portion 42 when viewed from the lamination direction. The width of the first portion 41 may be thicker than the width of the second portion 42 or may be the same as the width of the second portion 42.

Sixth Embodiment

Figure 14:
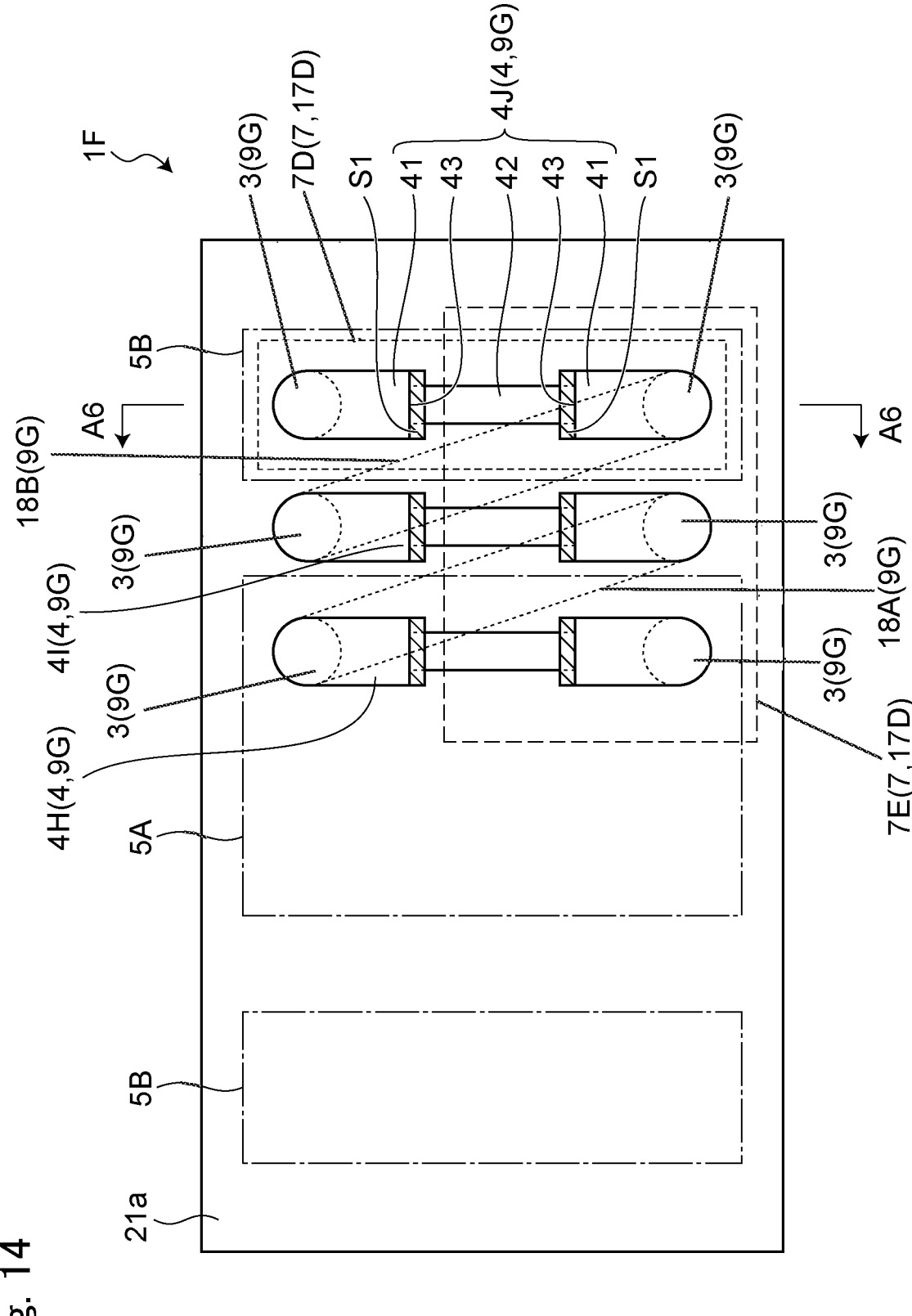
FIG. 14 is a plan view of an electronic component according to a sixth embodiment of the present disclosure.
Figure 15:
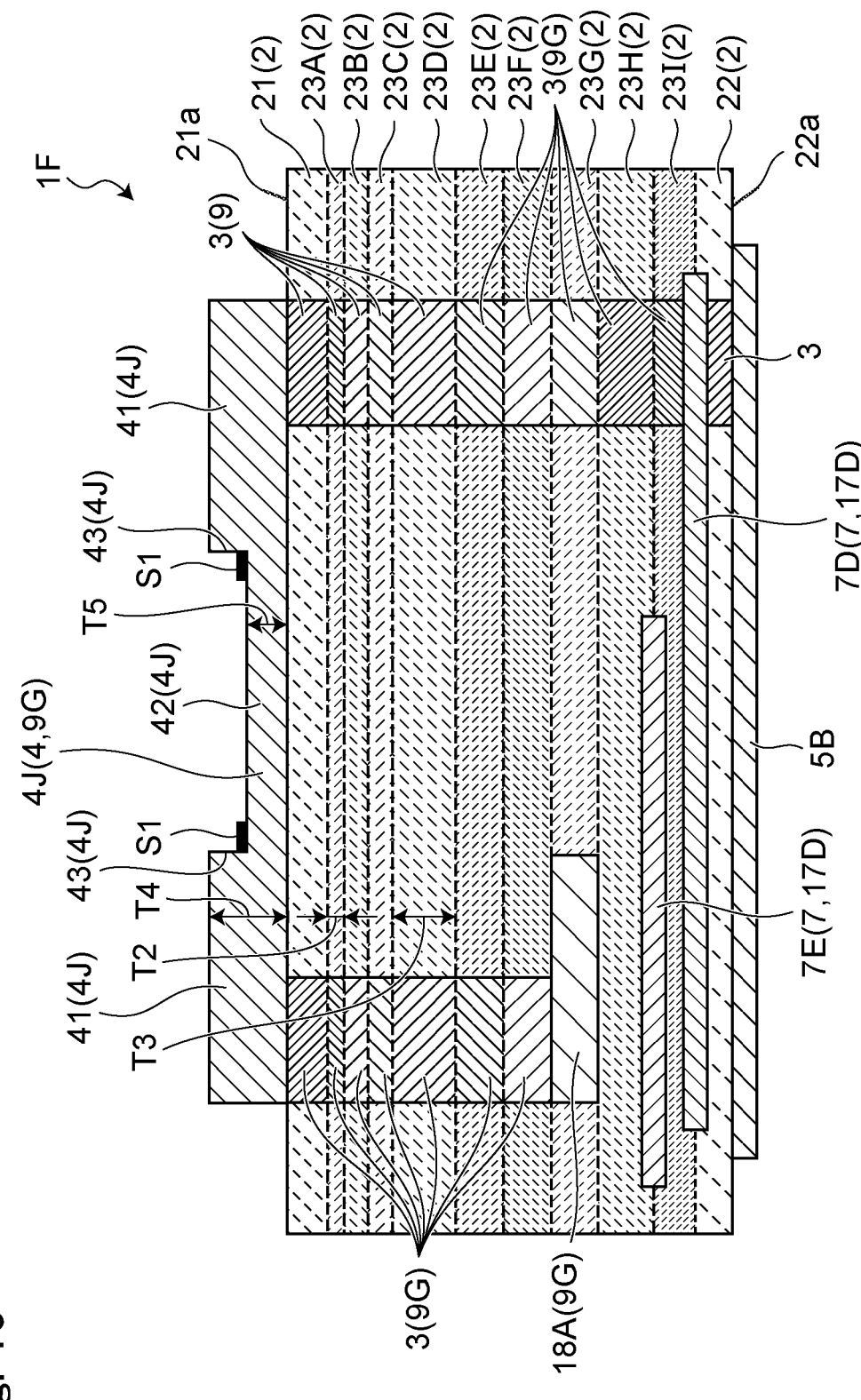
FIG. 15 is a cross-sectional view taken along line A6-A6 of the electronic component in FIG. 14.

Next, an electronic component according to a sixth embodiment of the present disclosure will be described with reference to FIGS. 14 to 15. FIG. 14 is a plan view of the electronic component according to the sixth embodiment of the present disclosure. FIG. 15 is a cross-sectional view of the electronic component taken along line A6-A6 in FIG. 14.

An electronic component 1F according to the sixth embodiment is different from the electronic component 1E according to the fifth embodiment in that the electronic component 1F includes a coil-shaped inductor 9G whose winding axis direction is a direction intersecting the lamination direction.

As illustrated in FIG. 14, the electronic component 1F includes three surface conductors 4, two internal conductors 7, and two inductor conductors 18A and 18B. The three surface conductors 4 include surface conductors 4H to 4J. The two internal conductors 7 include internal conductors 7D and 7E. Similarly to the electronic component 1D according to the fourth embodiment, the internal conductor 7D and the grounded internal conductor 7E face each other in the lamination direction to constitute a capacitor 17D.

Each of the surface conductors 4 extends in the short-side direction (up-down direction in FIG. 14) of the outer shape of the electronic component 1F when viewed from the lamination direction. In the present embodiment, the three surface conductors 4 are arranged in a non-rotationally symmetric manner with respect to the virtual center point of the electronic component 1F when viewed from the lamination direction.

As illustrated in FIG. 15, the inductor conductor 18B is formed in an intermediate layer 23G. That is, the inductor conductor 18B is formed between the intermediate layer 23F and the intermediate layer 23H. The thickness of the inductor conductor 18B is the same as or substantially the same as the thickness of the intermediate layer 23G. Similarly, the inductor conductor 18A (not illustrated in FIG. 15) is also formed in the intermediate layer 23G (that is, a portion between the intermediate layer 23F and the intermediate layer 23H). The inductor conductors 18A and 18B are formed, for example, by filling holes formed in portions corresponding to the inductor conductors 18A and 18B of the insulating layer sheet 12 (described later) with a conductive paste 16 (described later) and firing the paste 16.

One end portion of the surface conductor 4J is connected to the internal conductor 7D via ten via conductors 3 penetrating a first surface layer 21 and nine intermediate layers 23A to 23I. The other end portion of the surface conductor 4J is connected to one end portion of the inductor conductor 18B via seven via conductors 3 penetrating the first surface layer 21 and the six intermediate layers 23A to 23F. As illustrated in FIG. 14, the other end portion of the inductor conductor 18B is connected to one end portion of an end portion of the surface conductor 4I closer to one end portion of the surface conductor 4J via the via conductor 3. The other end portion of the surface conductor 4J is connected to one end portion of the inductor conductor 18A via the via conductor 3. The other end portion of the inductor conductor 18A is connected to one end portion of the end portion of the surface conductor 4H closer to one end portion of the surface conductor 4I via the via conductor 3. The other end portion of the surface conductor 4H is connected to the internal conductor 7E via the via conductor 3.

The surface conductor 4, the inductor conductor 18A, 18B, and the via conductor 3 connecting the surface conductor 4 and the inductor conductor 18A, 18B or each of the internal conductors 7D and 7E constitute the inductor 9G. The inductor 9G is a coil whose winding axis direction is a long-side direction of the outer shape of the electronic component 1F when viewed from the lamination direction. The via conductor 3 connected to each surface conductor 4 is an example of a "connection conductor" in the present disclosure.

As illustrated in FIG. 15, each surface conductor 4 includes a first portion 41 and a second portion 42 that is continuous with the first portion 41 along a surface 21a of the first surface layer 21 and is thinner in the lamination direction than the first portion 41. In the example illustrated in FIG. 15, a surface conductor 4J includes two first portions 41 and a second portion 42 arranged between the two first portions 41.

The thickness T4 of the first portion 41 is larger than the thickness T2 of the intermediate layer 23A and larger than the thickness of the internal conductor 7. For example, the thickness T4 of the first portion 41 is larger than the thickness of the thickest internal conductor 7 of the electronic component 1F. In the present embodiment, the thickness of the first portion 41 is larger than twice the thickness T2 of the intermediate layer 23A and larger than the thickness T3 of the intermediate layer 23D. In addition, the first portion 41 may be thicker than twice the thickness T3 of the intermediate layer 23D. The thickness T4 of the first portion 41 is, for example, 50 μm. The thickness T5 of the second portion 42 is, for example, 25 μm.

A boundary portion 43 between the first portion 41 and the second portion 42 is arranged in a non-rotationally symmetric manner with respect to the virtual center point of the electronic component 1F when viewed from the lamination direction. In the boundary portion 43, a shadow S1 is generated due to a difference in thickness between the first portion 41 and the second portion 42. FIG. 14 illustrates the shadows S1 generated when the electronic component 1F is illuminated from slightly above both end portions of the surface conductor 4.

According to the electronic component 1F according to the sixth embodiment, there is a difference in thickness at the boundary portion 43 between the first portion 41 and the second portion 42, and the shadow S1 is generated at the boundary portion 43. The shadow S1 can be used as a directional mark indicating the direction of the electronic component 1F. This eliminates the need to separately provide a directional mark, so that the manufacturing efficiency of the electronic component 1F can be improved. In addition, since the area occupied by the directional mark is unnecessary on the surface 21a of the insulating layer 2, it is possible to reduce the size of the electronic component 1F and to further arrange wiring, components, and the like.

<<Method for Manufacturing Electronic Component>>

Next, an example of a method for manufacturing an electronic component according to the present disclosure will be described with reference to FIGS. 16 to 24. FIGS. 16 to 24 are cross-sectional views illustrating an example of a method for manufacturing an electronic component according to the present disclosure. In FIGS. 21 and 24, a boundary line between a forming sheet 11 and an insulating layer sheet 12 (both will be described later) and a part of the conductive paste 16 (described later) are omitted for convenience of description.

As illustrated in FIG. 21, the electronic component 1 is manufactured by dividing a laminated body 10 into a plurality of laminated pieces 101. The laminated body 10 is formed by integrating the plurality of laminated pieces 101 in an arranged state. Each laminated piece 101 corresponds to one electronic component 1. In FIGS. 16 to 20, for convenience of description, only a portion corresponding to one laminated piece 101 of the laminated body 10 is illustrated.

(Sheet Forming Step)

Figure 16:
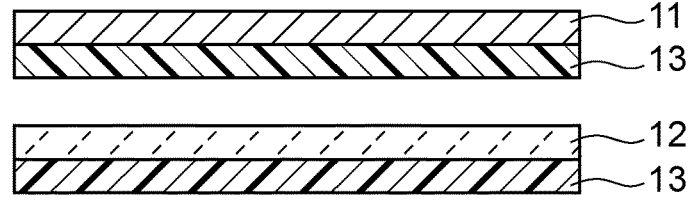
FIG. 16 is a cross-sectional view illustrating an example of a method for manufacturing an electronic component according to the present disclosure.

In the manufacture of the electronic component 1, first, as illustrated in FIG. 16, the forming sheet 11 for forming the surface conductor 4 and the insulating layer sheet 12 constituting the insulating layer 2 are formed. By mixing raw materials including a main agent, a plasticizer, a binder, and the like corresponding to each of the sheets 11 and 12, a slurry constituting each of the sheets 11 and 12 is prepared.

For the forming sheet 11, for example, a resin that burns out during firing (described later), a non-sinterable ceramic powder, or the like is used as a main agent. As a result, the forming sheet 11 can be burned out during firing or can be removed by cleaning after firing.

For the insulating layer sheet 12, for example, a sinterable ceramic powder or the like is used as a main agent. As the plasticizer, for example, phthalic acid ester or di-n-butyl phthalate is used. As the binder, for example, an acrylic resin, polyvinyl butyral, or the like is used.

The slurry constituting each of the sheets 11 and 12 is formed into a sheet shape on a carrier film 13 using, for example, a lip coater, a doctor blade, or the like. As a result, the sheets 11 and 12 as illustrated in FIG. 16 are obtained. As the carrier film 13, for example, a polyethylene tereph-thalate (PET) film or the like is used. The thickness of the forming sheet 11 is, for example, 1 to 150 $\mu$m before firing. In addition, the thickness of the insulating layer sheet 12 is set to, for example, a thickness such that the thickness after firing is 1 to 150 $\mu$m.

In the present manufacturing example, two forming sheets 11A and 11B (see FIGS. 17 and 18) for forming the surface conductor 4 and insulating layer sheets 12A to 12E (see FIGS. 17 to 19) for preparing five insulating layers 2A to 2E (see FIGS. 22 and 23) are prepared.

(Hole Portion Forming Step)

Figure 17:
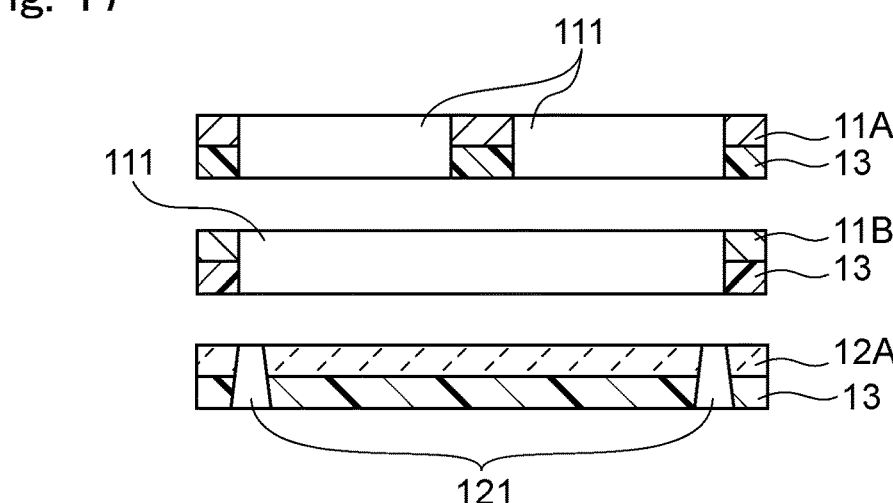
FIG. 17 is a cross-sectional view illustrating the example of the method for manufacturing an electronic component according to the present disclosure.

Next, as illustrated in FIG. 17, a surface conductor hole portion 111 penetrating the forming sheet 11 and the carrier film 13 is formed. In addition, in a case where an electronic component including the via conductors 3 is manufactured, via conductor hole portions 121 penetrating the insulating layer sheet 12 and the carrier film 13 are formed. For forming each hole portion 111,121, for example, a mechanical punch, a UV laser, a $CO_2$ laser, or the like is used.

(Filling Step)

Figure 18:
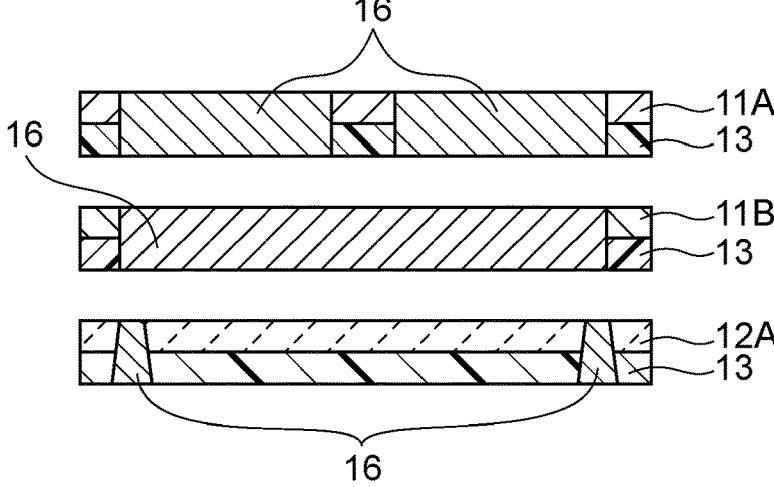
FIG. 18 is a cross-sectional view illustrating the example of the method for manufacturing an electronic component according to the present disclosure.

Next, as illustrated in FIG. 18, each hole portion 111,121 is filled with the conductive paste 16. The conductive paste 16 is prepared, for example, by mixing raw materials containing a conductive powder, a plasticizer, and a binder. In addition, for example, a eutectic material such as a ceramic powder mixed in each of the sheets 11 and 12 may be added to the conductive paste 16 in order to adjust the shrinkage rate during firing.

(Conductor Forming Step)

Figure 19:
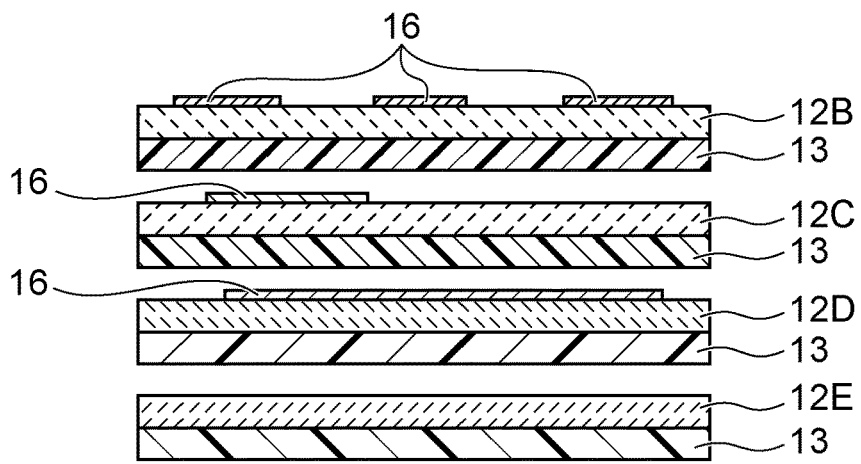
FIG. 19 is a cross-sectional view illustrating the example of the method for manufacturing an electronic component according to the present disclosure.

Next, as illustrated in FIG. 19, conductors thinner than the surface conductor 4 such as the land conductor 5 and the internal conductor 7 are formed. The conductive paste 16 is formed on the surface of the insulating layer sheet 12 by, for example, screen printing, inkjet printing, gravure printing, or the like. The composition of the conductive paste 16 may be changed according to the applied conductor.

(Lamination Step)

Figure 20:
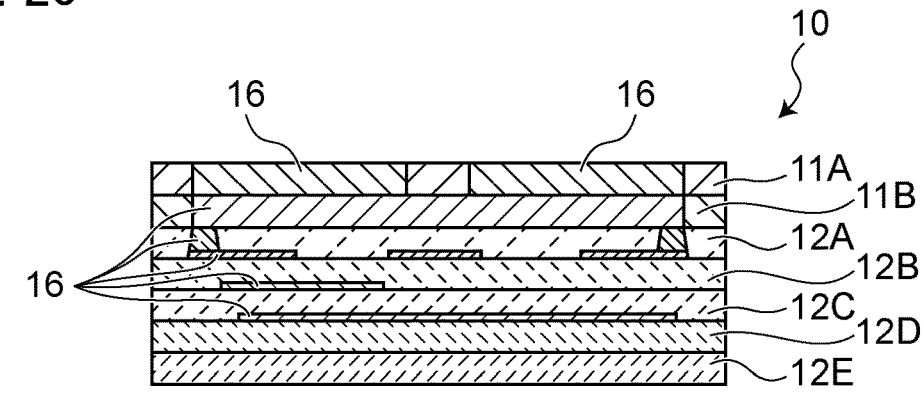
FIG. 20 is a cross-sectional view illustrating the example of the method for manufacturing an electronic component according to the present disclosure.
Figure 21:
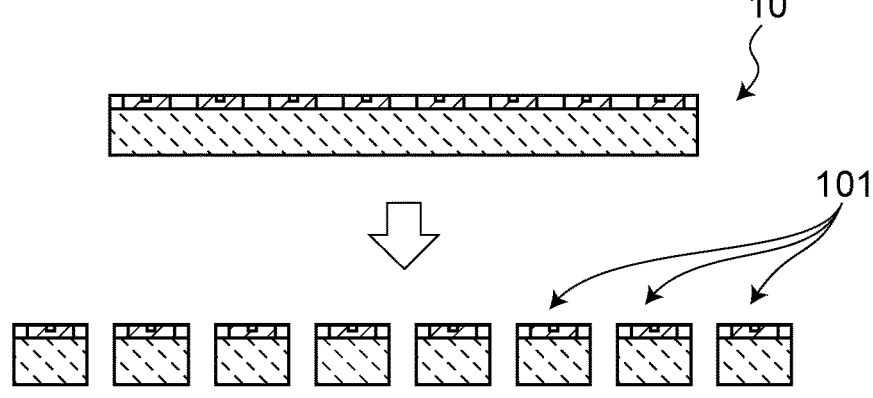
FIG. 21 is a cross-sectional view illustrating the example of the method for manufacturing an electronic component according to the present disclosure.

Next, as illustrated in FIG. 20, the sheets 11 and 12 excluding the carrier film 13 are laminated and pressure-bonded in a mold. By the steps so far, the laminated body 10 is obtained.

(Dividing Step)

Next, as illustrated in FIG. 21, the laminated body 10 is cut into laminated pieces 101 corresponding to one electronic component 1. For cutting the laminated body 10, for example, a dicing saw, a guillotine cutter, a laser, or the like is used. After the laminated body 10 is cut, the corners and edges of the laminated piece 101 may be polished by, for example, barrel processing or the like.

(Firing Step)

Figure 22:
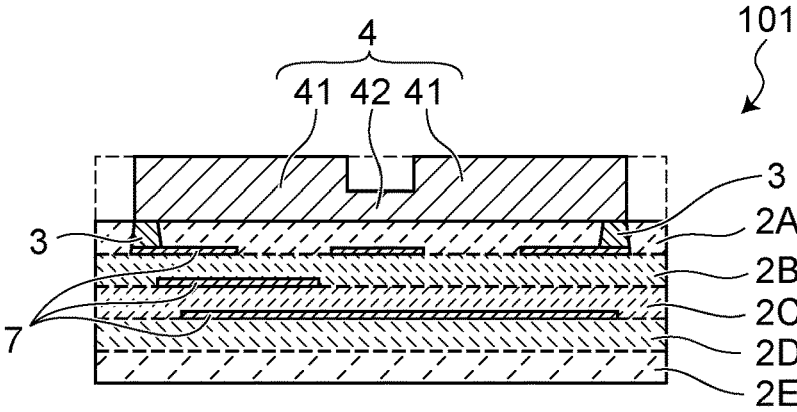
FIG. 22 is a cross-sectional view illustrating the example of the method for manufacturing an electronic component according to the present disclosure.

Then, by firing the laminated piece 101, the insulating layers 2A to 2E, the via conductors 3, the surface conductor 4, the land conductor 5, and the internal conductors 7 are obtained. At this time, in a case where the forming sheet 11 is configured to burn out, the forming sheet 11 is removed as illustrated in FIG. 22. In addition, in a case where the forming sheet 11 is configured not to burn out, the forming sheet 11 is removed by cleaning the laminated piece 101 after firing.

(Trimming Step)

Figure 23:
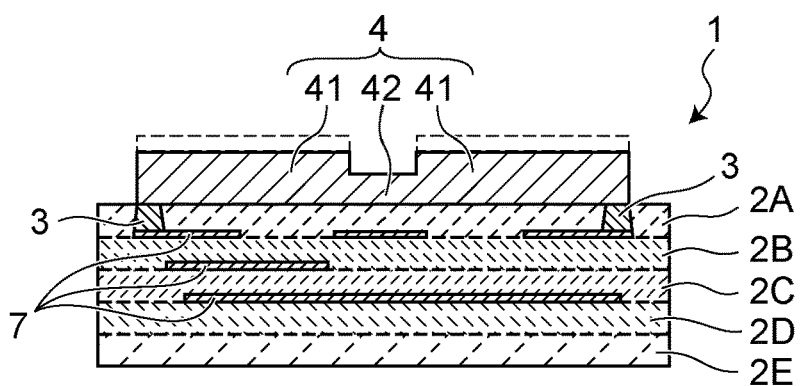
FIG. 23 is a cross-sectional view illustrating the example of the method for manufacturing an electronic component according to the present disclosure.
Figure 24:
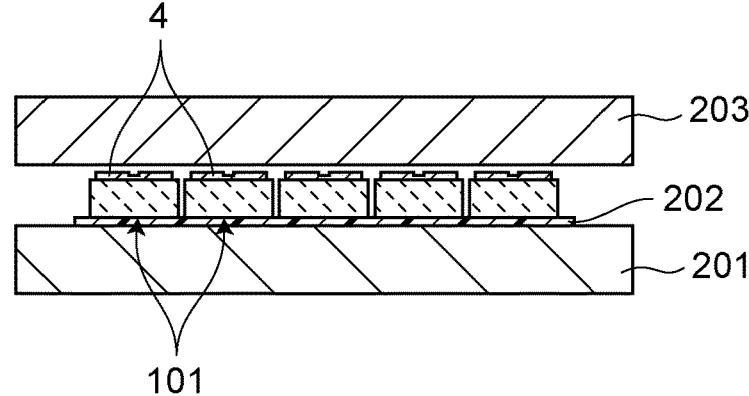
FIG. 24 is a cross-sectional view illustrating the example of the method for manufacturing an electronic component according to the present disclosure.

Then, as illustrated in FIG. 23, the surface conductor 4 is trimmed as necessary. As a result, the electrical characteristics of an element or the like are adjusted. At this time, since the first portion 41 of the surface conductor 4 is thicker than the second portion 42, only the first portion 41 can be trimmed by a planar processing method. Examples of the planar processing method include etching and surface grinding.

When trimming is performed by surface grinding, for example, as illustrated in FIG. 24, the plurality of laminated pieces 101 are arranged such that the surface corresponding to the surface 22a of the second surface layer 22 is in contact with an adhesive sheet 202 arranged on a stage 201. At this time, the surface conductors 4 provided on the laminated pieces 101 face the opposite side (the upper side in FIG. 24) of the stage 201. By bringing a grindstone 203 into contact with the surface conductors 4 provided on the plurality of laminated pieces 101, it is possible to simultaneously perform planar processing on the plurality of laminated pieces 101.

By the trimming, the thickness of the surface conductor 4 is reduced. That is, the conductor cross-sectional area of the surface conductor 4 decreases. As a result, the electrical characteristics of an element or the like including the surface conductor 4 can be adjusted. For example, in the second embodiment in which the surface conductor 4 constitutes a part of the inductor 9, when the surface conductor 4 is trimmed, the inductance value of the inductor 9 increases. As a result, when the inductor 9 constitutes a part of the resonator, the resonance frequency of the resonance circuit decreases.

Through the above steps, the electronic component 1 in which the surface conductor 4 is exposed is manufactured. Further, when the plating film 6, the resin layer 8, and the like are formed, the electronic component 1A illustrated in FIGS. 1 to 3, the electronic component 1B illustrated in FIGS. 4 to 6, and the like are obtained.

<<Resin Layer Forming Method>>

Figure 25:
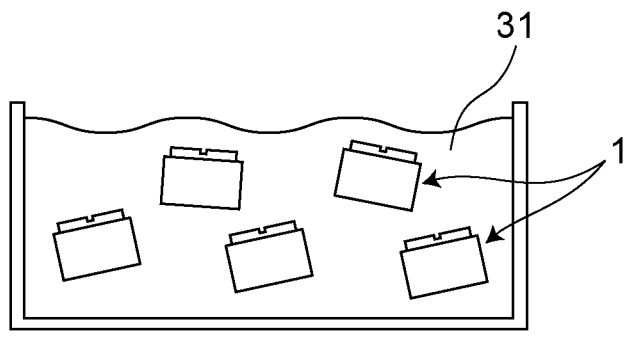
FIG. 25 is a view illustrating an example of a resin layer forming method for an electronic component according to the present disclosure.
Figure 26:
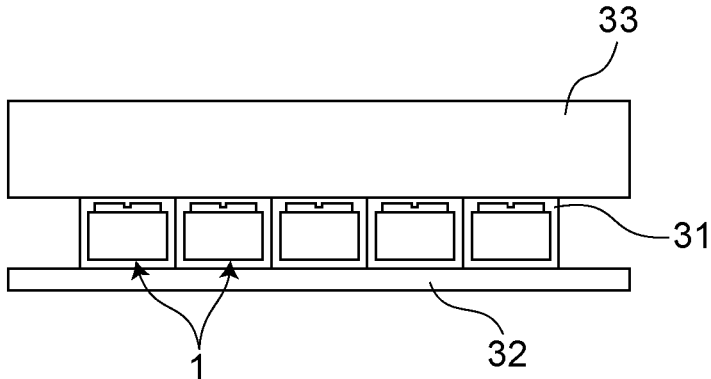
FIG. 26 is a view illustrating the example of the resin layer forming method for an electronic component according to the present disclosure.
Figure 27:
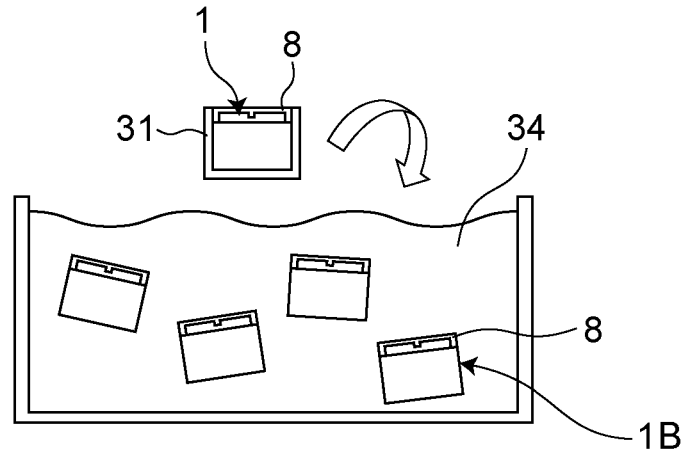
FIG. 27 is a view illustrating the example of the resin layer forming method for an electronic component according to the present disclosure.

Next, an example of a resin layer forming method for the electronic component according to the present disclosure will be described with reference to FIGS. 25 to 27. FIGS. 25 to 27 are views illustrating an example of a resin layer forming method for the electronic component according to the present disclosure.

In the present forming method, the electronic component 1B illustrated in FIGS. 4 to 6 is obtained by further forming the resin layer 8 on the electronic component 1 manufactured by the above-described method.

(Immersion Step)

First, as illustrated in FIG. 25, the electronic component 1 manufactured as described above is immersed in a liquid resin 31. As a result, the resin 31 adheres to the outer surface of the electronic component 1. As the resin 31, a resin that can be cured only in a desired region is selected. Examples of the resin 31 include a thermosetting resin and an ultraviolet curable resin.

After the immersion, as illustrated in FIG. 26, the electronic component 1 is arranged on an adhesive surface of an adhesive sheet 32 with the vertical direction aligned.

23

24

(Curing Step)

Next, the resin 31 attached to the region of the electronic component 1 where the resin layer 8 is to be formed is subjected to a curing treatment to form the resin layer 8. For example, when a thermosetting resin is used, as illustrated in FIG. 26, a hot plate 33 is pressed against the upper surface of the electronic component 1, whereby only the resin 31 attached to the upper surface can be cured.

When an ultraviolet curable resin is used, the resin 31 can be cured by irradiating a desired region including at least a part of the surface conductor 4 with ultraviolet rays. In addition, by applying a mask that does not transmit ultraviolet rays to a region where the resin layer 8 is not formed, formation of the resin layer 8 outside a desired region can be prevented.

(Removal Step)

Next, the uncured resin 31 is removed from the electronic component 1. For example, as illustrated in FIG. 27, the uncured resin 31 is removed by cleaning the electronic component 1 in a cleaning liquid 34. Through the above steps, the electronic component 1B including the resin layer 8 is manufactured.

According to this forming method, the resin layer 8 can be formed by attaching the resin 31 to the entire electronic component 1 and curing the resin 31 only at a desired portion on the electronic component 1. Therefore, unlike the method for forming the resin layer 8 by applying the resin 31 only to a desired portion, it is not necessary to align the electronic components 1 in order to attach the resin 31. Therefore, the manufacturing efficiency of the electronic component 1B can be improved.

Note that the present disclosure is not limited to the embodiments and the example of the manufacturing method, and can be implemented in various other modes. For example, in the above description, the electronic components 1A to 1F include the five or eleven insulating layers 2, but the present disclosure is not limited thereto. The electronic components 1A to 1F only need to include at least one insulating layer 2, and the number of laminated layers is not limited.

In the above description, the via conductor 3 is an example of the connection conductor, but the connection conductor is not limited to the via conductor 3. For example, the connection conductor may be a wiring pattern (not illustrated) formed on the front surface 21*a* of the first surface layer 21, the land conductor 5 (see FIG. 1), or the like. In addition, the "plurality of connection conductors" in the present disclosure may be one of the via conductors 3, the wiring patterns, the land conductors 5, and the like, or may be a combination thereof.

In the above description, the first portions 41 of the surface conductor 4A and the surface conductor 4B are trimmed in the thickness direction, but the present disclosure is not limited thereto. The surface conductor 4 may be trimmed not only in the thickness direction but also in the width direction. In the surface conductor 4B, only a part of the first portion 41 of the surface conductor 4B may be trimmed. In addition, the second portion 42 may be trimmed. As the trimming method, not only a planar processing method but also a method using a laser, for example, can be adopted. The trimming step is a step performed as necessary, and is not an essential step in the manufacture of the electronic components 1, 1A, and 1B.

In the above description, the surface conductor 4 is arranged on the surface 21*a* of the first surface layer 21, but may be arranged on another surface. For example, the surface conductor 4 may be arranged on the surface 22*a* of the second surface layer 22, or may be arranged on both the surface 21*a* of the first surface layer 21 and the surface 22*a* of the second surface layer 22.

In the second embodiment, the three surface conductors 4 are arranged in parallel to each other, but the present disclosure is not limited thereto. The number of surface conductors 4 may be arbitrary. In addition, even when the surface conductors 4 constitute a part of the inductor, the surface conductors 4 are not necessarily arranged in parallel.

In the second embodiment, the "inductor conductor" in the present disclosure is the internal conductor 7, but the present disclosure is not limited thereto. The "inductor conductor" in the present disclosure only needs to be electrically connected to the surface conductor 4 via the via conductor 3, and may be, for example, a conductor formed on the insulating layer 2, a conductor formed on the surface 22*a* of the second surface layer 22, wire bonding, or the like.

In the second embodiment, the winding axis direction of the inductor 9 is the direction in which the insulating layer 2 extends and the direction perpendicular to the direction in which the surface conductor 4 extends, but the present disclosure is not limited thereto. The winding axis direction of the inductor 9 is not particularly limited, and may be, for example, the lamination direction of the insulating layer 2.

In the second embodiment, the surface conductor 4 is covered with the resin layer 8, but may be covered with a glass layer instead of the resin layer 8. Even when the surface conductor 4 is covered with the glass layer, the same effect as the above-described effect by the resin layer 8 covering the surface conductor 4 is achieved.

In the second embodiment, the resin layer 8 is formed on the entire surface 21*a* of the first surface layer 21, but the present disclosure is not limited thereto. For example, the resin layer 8 may be formed such that the thickness from the first surface layer 21 is thinner than that of the surface conductor 4 and the resin layer 8 surrounds the surface conductor 4 in plan view.

In the above description, the resin layer 8 is formed by immersing the electronic component 1 in the liquid resin 31, but the method for forming the resin layer 8 is not limited thereto. For example, the resin layer 8 may be formed by applying a resin only to a desired region of the electronic component and curing the resin. Examples of the applying method in such a case include screen printing, inkjet printing, and dispensing.

Note that, by appropriately combining any embodiments from the various embodiments described above, the effects of the respective embodiments can be achieved.

Although the present disclosure has been fully described in connection with preferred embodiments with reference to the accompanying drawings, various modifications and corrections will be apparent to those skilled in the art. Such modifications and corrections are to be understood as being included within the scope of the present disclosure as set forth in the appended claims as long as they do not depart therefrom.

Since the electronic component according to the present disclosure has a large trimmable thickness of a conductor and a large adjustment range of electrical characteristics of an element or the like, it is useful for an electronic component or the like that requires trimming of a conductor.

1, 1A-1F electronic component
    2, 2A-2E insulating layer
    21 first surface layer
    21*a* surface
    22 second surface layer
    22*a* surface 23, 23A-231 intermediate layer
3 via conductor
4, 4A-4J surface conductor
41 first portion
42 second portion
43 boundary portion
5, 5A, 5B land conductor
6 plating film
7, 7A-7E internal conductor
8 resin layer
8a outer surface
9, 9A-9G inductor
10 laminated body
101 laminated piece
11, 11A, 11B forming sheet
111 surface conductor hole portion
12, 12A-12E insulating layer sheet
121 via conductor hole portion
13 carrier film
16 conductive paste
17A-17D capacitor
18A, 18B inductor conductor
31 resin
32 adhesive sheet
33 hot plate
34 cleaning liquid
201 stage
202 adhesive sheet
203 grindstone

The invention claimed is:

1. An electronic component comprising:
a plurality of laminated insulating layers;
one or more surface conductors formed on a surface of the insulating layers; and
at least one internal conductor formed at a boundary portion between adjacent ones of the insulating layers,
   wherein the one or more surface conductors have a thickness from the surface of the insulating layers, and
   the thickness of the one or more surface conductors is more than twice a thickness of a thinnest layer of the insulating layers and more than a thickness of the at least one internal conductor.

2. The electronic component according to claim 1, wherein the thickness of the one or more surface conductors is more than the thickness of a thickest layer of the insulating layers.

3. The electronic component according to claim 1, wherein a plating film is formed on at least a part of the surface of the surface conductors.

4. The electronic component according to claim 1, further comprising:
a plurality of connection conductors formed inside the insulating layers or on the surface of the insulating layers and connected to one of the surface conductors,
   wherein the at least one internal conductor comprises a plurality of internal conductors, and
   wherein the plurality of connection conductors are connected to the at least one internal conductor different from each other.

5. The electronic component according to claim 4, wherein at least one of the plurality of connection conductors is a via conductor penetrating one of the plurality of insulating layers in a lamination direction of the insulating layers.

6. The electronic component according to claim 4, further comprising an inductor conductor electrically connected to the surface conductors via the plurality of connection conductors,
   wherein the surface conductors constitute at least a part of an inductor together with the plurality of connection conductors and the inductor conductor.

7. The electronic component according to claim 1, wherein the surface conductors comprise:
a first portion being thicker than the thickness of the thinnest layer of the insulating layers and being thicker than the thickness of the at least one internal conductor; and
a second portion being continuous with the first portion along the surface of the insulating layers and being thinner than the first portion.

8. The electronic component according to claim 7, having a rotationally symmetric outer shape in a plan view,
   wherein a boundary portion between the first portion and the second portion in the surface conductors is arranged in a non-rotationally symmetric manner with respect to a center point of a rotational symmetry of the electronic component.

9. The electronic component according to claim 1, having a rotationally symmetric outer shape in a plan view,
   wherein the surface conductors are arranged in a non-rotationally symmetric manner with respect to a center point of a rotational symmetry of the electronic component in the plan view.

10. The electronic component according to claim 1, further comprising a resin layer or a glass layer covering at least a part of the surface conductors.

11. The electronic component according to claim 10, wherein at least a part of the resin layer or at least a part of the glass layer is thicker than the thickness of the thinnest layer of the insulating layers and thicker than the thickness of the at least one internal conductor.

12. The electronic component according to claim 1, further comprising a via conductor penetrating one of the plurality of insulating layers in a lamination direction of the insulating layers,
   wherein the thickness of the one or more surface conductors is more than a length of the via conductor in the lamination direction.

13. The electronic component according to claim 12, wherein the surface conductors comprise:
a first portion being thicker than the length of the via conductor in the lamination direction; and
a second portion being continuous with the first portion along a surface of the insulating layers and being thinner than the first portion.

14. The electronic component according to claim 1, wherein the surface conductors constitute at least a part of an inductor.

15. A resin layer forming method for an electronic component comprising:
an immersion step of immersing an electronic component according to claim 1 in a resin to attach the resin to an outer surface of the electronic component including a surface of the insulating layers;
a curing step of curing the resin attached to at least a part of the surface conductors to form a resin layer; and
a removal step of removing uncured portions of the resin from the electronic component.

16. The electronic component according to claim 1, wherein the thickness of the one or more surface conductors is more than the thickness of a thickest layer of the insulating layers.

17. The electronic component according to claim 1, wherein a plating film is formed on at least a part of the surface of the surface conductors.

18. An electronic component according to claim 2, wherein a plating film is formed on at least a part of the surface of the one or more surface conductors.

19. The electronic component according to claim 1, further comprising:

a plurality of connection conductors formed inside the insulating layers or on the surface of the insulating layers and connected to one of the surface conductors, wherein the at least one internal conductor comprises a plurality of internal conductors, and wherein the plurality of connection conductors are connected to the at least one internal conductor different from each other.

\* \* \* \* \*